United States Patent
Zhu

(10) Patent No.: US 12,538,515 B2
(45) Date of Patent: Jan. 27, 2026

(54) GATE-ALL-AROUND/MULTI-GATE SEMICONDUCTOR DEVICE WITH BODY CONTACT, METHOD OF MANUFACTURING GATE-ALL-AROUND/MULTI-GATE SEMICONDUCTOR DEVICE WITH BODY CONTACT, AND ELECTRONIC APPARATUS

(71) Applicant: INSTITUTE OF MICROELECTRONICS, CHINESE ACADEMY OF SCIENCES, Beijing (CN)

(72) Inventor: Huilong Zhu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 356 days.

(21) Appl. No.: 18/232,513

(22) Filed: Aug. 10, 2023

(65) Prior Publication Data
US 2024/0072135 A1    Feb. 29, 2024

(30) Foreign Application Priority Data
Aug. 23, 2022    (CN) .......................... 202211015574.7

(51) Int. Cl.
*H10D 30/60*    (2025.01)
*H10D 30/01*    (2025.01)
(Continued)

(52) U.S. Cl.
CPC ......... *H10D 30/611* (2025.01); *H10D 30/023* (2025.01); *H10D 30/6729* (2025.01);
(Continued)

(58) Field of Classification Search
CPC .............. H10D 30/023; H10D 30/025; H10D 30/0273; H10D 30/501–509; H10D 30/611; H10D 30/63; H10D 30/6729; H10D 30/6735; H10D 30/674; H10D 30/6757; H10D 30/721; H10D 62/10; H10D 62/121; H10D 62/124; H10D 62/128; H10D 62/129; H10D 62/292; H10D 64/017;
(Continued)

(56) References Cited

U.S. PATENT DOCUMENTS

2018/0097111 A1*    4/2018    Zhu ..................... H10D 30/025

* cited by examiner

*Primary Examiner* — Cheung Lee
(74) *Attorney, Agent, or Firm* — Westman, Champlin & Koehler, P.A.

(57) ABSTRACT

Provided are a vertical semiconductor device with a body contact, a manufacturing method, and an electronic apparatus. The semiconductor device includes: an active region vertically disposed on a substrate relative to the substrate, including lower and upper source/drain regions, and a middle portion between the lower and upper source/drain regions for defining a channel region; first and second gate stacks which are disposed on first and second sides of the active region which are opposite to each other in a lateral direction relative to the substrate; and a body contact layer disposed on the second side of the active region to overlap a part of the middle portion of the active region, so as to apply a body bias to the active region, wherein the second gate stack includes first and second portions below and above the body contact layer respectively.

39 Claims, 23 Drawing Sheets

(51) Int. Cl.
*H10D 30/67* (2025.01)
*H10D 62/10* (2025.01)
*H10D 64/01* (2025.01)
*H10D 84/01* (2025.01)
*H10D 84/03* (2025.01)
*H10D 84/83* (2025.01)

(52) U.S. Cl.
CPC ..... *H10D 30/6735* (2025.01); *H10D 30/6757* (2025.01); *H10D 62/121* (2025.01); *H10D 64/017* (2025.01); *H10D 84/0128* (2025.01); *H10D 84/013* (2025.01); *H10D 84/038* (2025.01); *H10D 84/83* (2025.01)

(58) Field of Classification Search
CPC .. H10D 84/01; H10D 84/0128; H10D 84/013; H10D 84/0149; H10D 84/0156; H10D 84/016; H10D 84/032; H10D 84/035; H10D 84/038; H10D 84/05; H10D 84/07; H10D 84/08; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839
See application file for complete search history.

GATE-ALL-AROUND/MULTI-GATE SEMICONDUCTOR DEVICE WITH BODY CONTACT, METHOD OF MANUFACTURING GATE-ALL-AROUND/MULTI-GATE SEMICONDUCTOR DEVICE WITH BODY CONTACT, AND ELECTRONIC APPARATUS

CROSS REFERENCE TO RELATED APPLICATION

This application claims priority to Chinese Patent Application No. 202211015574.7, filed on Aug. 23, 2022, the entire content of which is incorporated herein in its entirety by reference.

TECHNICAL FIELD

The present disclosure relates to a field of semiconductors, and in particular, to a gate-all-around or multi-gate vertical semiconductor device with a body contact, a method of manufacturing a gate-all-around or multi-gate vertical semiconductor device with a body contact, and an electronic apparatus including the semiconductor device.

BACKGROUND

In order to meet a demand for a continuous miniaturization of a metal oxide semiconductor field effect transistor (MOSFET), various types of devices are proposed, such as a fin field effect transistor (FinFET), a multi-bridge channel field effect transistor (MBCFET), etc. However, they may still have some limitations.

A vertical FET is a MOSFET with a prospect in miniaturization. However, a fully depleted vertical FET has a floating-body effect, which may lead to a threshold voltage (Vt) shift and increase an off current. The floating-body effect may be suppressed by using a body contact. However, the body contact may increase a channel thickness, and deteriorate a device performance, such as worsen a short channel control. At present, it is difficult to manufacture a high-quality body contact on a vertical device.

SUMMARY

In view of this, an object of the present disclosure is, at least in part, to provide a gate-all-around or multi-gate vertical semiconductor device with a body contact, a method of manufacturing a gate-all-around or multi-gate vertical semiconductor device with a body contact, and an electronic apparatus including the semiconductor device.

According to an aspect of the present disclosure, there is provided a semiconductor device, including: an active region vertically disposed on a substrate with respect to the substrate, wherein the active region includes a lower source/drain region, an upper source/drain region, and a middle portion which is located between the lower source/drain region and the upper source/drain region and used to define a channel region; a first gate stack and a second gate stack, wherein the first gate stack and the second gate stack are disposed on a first side of the active region and a second side of the active region which is opposite to the first side of the active region in a lateral direction with respect to the substrate; and a body contact layer disposed on the second side of the active region to overlap a part of the middle portion of the active region, so as to apply a body bias to the active region, wherein the second gate stack includes a first portion below the body contact layer and a second portion above the body contact layer.

According to another aspect of the present disclosure, there is provided a method of manufacturing a semiconductor device, including: providing, on a substrate, a stack of a first source/drain defining layer, a first channel defining layer, a body contact defining layer, a second channel defining layer and a second source/drain defining layer; forming an active layer on a vertical sidewall of the stack extending in a first direction; respectively driving a dopant in the first source/drain defining layer, a dopant in the body contact defining layer and a dopant in the second source/drain defining layer into corresponding portions of the active layer, so as to form a lower source/drain region, a body contact region and an upper source/drain region, respectively; forming an isolation layer surrounding the stack; removing the first channel defining layer and the second channel defining layer; forming a gate stack on the isolation layer, wherein the gate stack includes a first gate stack and a second gate stack, the first gate stack and the second gate stack are disposed on a first side and a second side which are opposite to each other in a second direction intersecting the first direction, and the second gate stack enters a space between the first source/drain defining layer and the body contact defining layer and a space between the body contact defining layer and the second source/drain defining layer; and forming a body contact portion to the body contact defining layer.

According to another aspect of the present disclosure, there is provided an electronic apparatus including the above-mentioned semiconductor device.

According to embodiments of the present disclosure, the body contact is provided for the vertical semiconductor device, so that a floating-body effect may be suppressed. In addition, due to a gate-all-around or multi-gate configuration, a gate control of a channel may be improved, and a device performance (e.g., on current, etc.) may be enhanced.

BRIEF DESCRIPTION OF THE DRAWINGS

The above and other objectives, features, and advantages of the present disclosure will be clearer through the following descriptions of embodiments of the present disclosure with reference to accompanying drawings, in which.

Throughout the accompanying drawings, the same or similar reference numerals indicate the same or similar components.

DETAILED DESCRIPTION OF EMBODIMENTS

Figure 1:
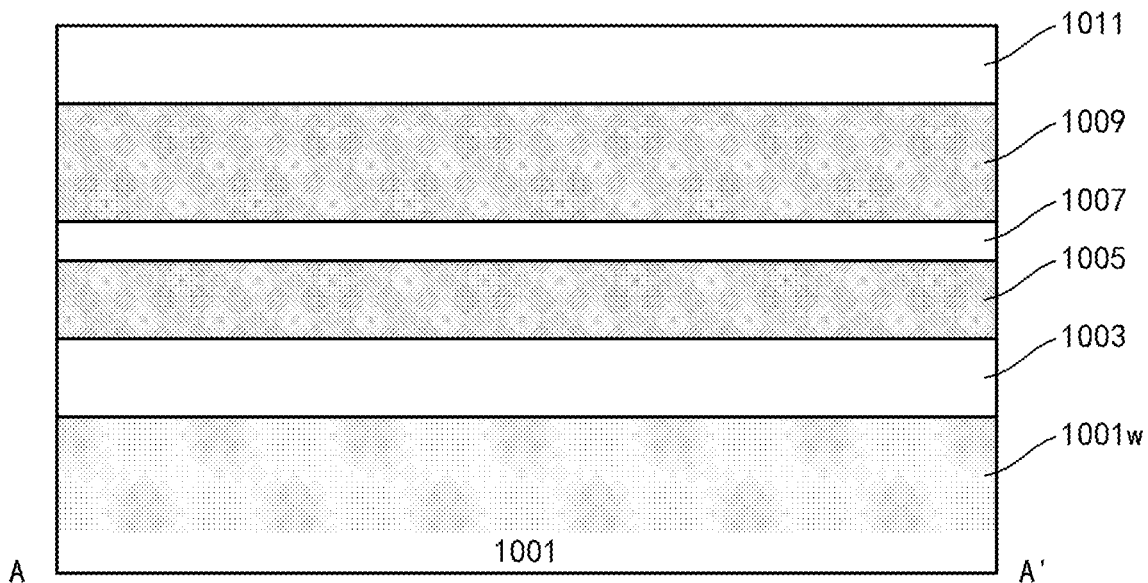
FIG. 1 to FIG. 13(c) show schematic diagrams of some stages in a process of manufacturing a semiconductor device according to an embodiment of the present disclosure.

Embodiments of the present disclosure will be described below with reference to the accompanying drawings. It should be understood, however, that these descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to embodiments of the present disclosure are shown in the accompanying drawings. The drawings are not drawn to scale. Some details are enlarged and some details may be omitted for clarity of presentation. Shapes of the various regions, layers as well as a relative size and a positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being located "on" a further layer/element, the layer/element may be directly on the further layer/element, or there may be an intermediate layer/element therebetween. In addition, if a layer/element is located "on" a further layer/element in an orientation, the layer/element may be located "under" the further layer/element when the orientation is reversed.

According to embodiments of the present disclosure, there is provided a gate-all-around or multi-gate vertical semiconductor device with a body contact. The vertical device may include an active region vertically disposed with respect to a substrate (e.g., in a direction substantially perpendicular to a substrate surface), including a lower source/drain region disposed at a lower end of the active region and an upper source/drain region disposed at an upper end of the active region. A middle portion of the active region between the lower source/drain region and the upper source/drain region may define a channel region. The lower source/drain region and the upper source/drain region may be electrically connected with each other through the channel region. The lower source/drain region and the upper source/drain region may be defined through a doping region. The channel region may also be doped as required.

A gate stack may be disposed to overlap the middle portion (or the channel region) of the active region, so as to control an on-off of a conductive channel in the channel region. The gate stack may include a first gate stack and a second gate stack. The first gate stack and the second gate stack are disposed on a first side and a second side which are opposite to each other of the active region in a lateral direction (a direction substantially parallel to the substrate surface).

In order to optimize a device performance, the gate stack may have different configurations.

For example, the gate stack may have a gate-all-around (GAA) configuration, that is, the gate stack including the first gate stack and the second gate stack may surround a periphery of the active region (especially, the channel region). In this case, the first gate stack and the second gate stack may be portions of a same gate stack on the first side of the active region and the second side of the active region, respectively.

For another example, the first gate stack and the second gate stack may be electrically isolated from each other (e.g., through a dielectric layer therebetween), so that a multi-gate configuration may be formed. The first gate stack and the second gate stack which are isolated from each other may be used for different purposes, for example, one of which, such as the first gate stack, may be used as a control gate, while the other, such as the second gate stack, may be used to control a threshold voltage (Vt). The first gate stack and the second gate stack may have different characteristics from each other, such as (effective) work functions.

The gate-all-around or multi-gate configuration may improve a gate control of a channel and enhance the device performance.

A body contact layer may be provided on the second side of the active region. The body contact layer may overlap the middle portion (or a body portion) of the active region, so as to apply a body bias to the active region and thus control a floating-body effect.

The active region, especially the middle portion thereof, may be provided with a doping region as a body contact region, and the body contact layer may apply the body bias to the active region through the body contact region. The body contact region may occupy only a part of the middle portion of the active region in a vertical direction, and thus may have a different doping characteristic from a remaining portion of the middle portion of the active region. For example, the remaining portion of the middle portion of the active region may not be intentionally doped or have different doping concentrations. As described below, the body contact region may be self-aligned with the body contact layer. For example, the body contact region may be formed by (substantially laterally) driving a dopant into the active region from the body contact layer.

A spacing distance between the body contact layer (and thus the body contact region) and the lower source/drain region and the upper source/drain region in the vertical direction may be adjusted as required. For example, the spacing distance is substantially the same or biased towards the lower source/drain region or the upper source/drain region. As described below, the distance adjustment may be achieved through a film thickness of an epitaxial semiconductor layer, and thus a film thickness accuracy of an epitaxial growth process may be achieved.

The second gate stack may include a first portion below the body contact layer and a second portion above the body contact layer. Specifically, the first portion of the second gate stack may overlap the middle portion (or accordingly, the channel region) of the active region in a region between the body contact layer (or accordingly, the body contact region) and the lower source/drain region, and the second portion of the second gate stack may overlap the middle portion (or accordingly, the channel region) of the active region in a region between the body contact layer (or accordingly, the body contact region) and the upper source/drain region. Therefore, on the second side, on the one hand, the middle portion (or accordingly, the channel region) of the active region may receive the body bias applied by the body contact layer in the middle, and thus may reduce the floating-body effect; on the other hand, the middle portion (or accordingly, the channel region) of the active region may be controlled by the first portion of the second gate stack and the second portion of the second gate stack below and above the body contact layer respectively, and thus the device performances, such as a Vt adjustment, a gate-induced drain leakage (GIDL) control, etc., may be optimized.

The first portion of the second gate stack and the second portion of the second gate stack may be portions of a same gate stack below and above the body contact layer, respectively, and they may extend continuously (bypassing the body contact layer). Alternatively, the first portion of the second gate stack and the second portion of the second gate stack may be portions formed respectively and having different characteristics such as (effective) work functions.

The first portion of the second gate stack and the second portion of the second gate stack may receive a same bias, or may be electrically isolated from each other and thus may receive different biases. In addition, the second portion (and optionally, the first portion) of the second gate stack and the body contact layer may also receive the same bias.

Therefore, various different gate control solutions may be provided: the first gate stack and the second gate stack receive a same gate control voltage (especially in a gate-all-around configuration); the first gate stack receives a first gate control voltage, and the second gate stack including the first portion and the second portion receives a second gate control voltage that is separately applied from the first gate control voltage; the first gate stack receives the first gate control voltage, and the first portion of the second gate stack and the second portion of the second gate stack may receive the second gate control voltage and a third gate control voltage that are respectively applied to each other.

The body contact layer may extend laterally, so that a body contact portion for applying the body bias may be landed thereon.

Similarly, an upper source/drain region contact layer in contact with the upper source/drain region may be provided on the second side of the active region. The upper source/drain region contact layer may extend laterally, so that an upper source/drain region contact portion for applying/outputting an electrical signal to/from the upper source/drain region may be landed thereon. As described below, the upper source/drain region may be self-aligned with the upper source/drain region contact layer. For example, the upper source/drain region may be formed by (substantially laterally) driving a dopant into the active region from the upper source/drain region contact layer.

A spacing between the upper source/drain region contact layer and the body contact layer in the vertical direction may be substantially uniform. As described below, the spacing may be achieved through the film thickness of the epitaxial semiconductor layer, and thus the film thickness accuracy of the epitaxial growth process may be achieved.

The active region may be provided by an active layer of a semiconductor. The active layer may be in a form of a nanosheet or a nanowire, and may include a vertical extension portion extending in the vertical direction to provide the above-mentioned vertical active region. In addition, the active layer may further include a lateral extension portion extending from a lower end (more specifically, the lower source/drain region) of the vertical extension portion far away from the vertical extension portion on the first side. The lateral extension portion helps to form a lower source/drain region contact portion to the lower source/drain region. For example, the lateral extension portion of the active layer may extend beyond an upper gate stack, and the lower source/drain region contact portion may be landed thereon.

The active layer may be formed on a lower source/drain region defining layer. The lower source/drain region defining layer may extend from below the lateral extension portion of the active layer to a surface of the vertical extension portion of the active layer on the second side. As described below, the lower source/drain region may be self-aligned with a portion of the lower source/drain region defining layer on the second side. For example, the lower source/drain region may be formed by driving a dopant into the active layer from the lower source/drain region defining layer.

A spacing between the lower source/drain region defining layer and the body contact layer in the vertical direction may be substantially uniform. As described below, the spacing may be achieved through the film thickness of the epitaxial semiconductor layer, and thus the film thickness accuracy of the epitaxial growth process may be achieved.

The active layer may be an epitaxial layer on the lower source/drain region defining layer, the body contact layer and the upper source/drain region contact layer, and thus may have a crystal interface with the lower source/drain region defining layer, the body contact layer and the upper source/drain region contact layer. The layers may all be single crystal semiconductors.

According to the embodiments, such a vertical semiconductor device may be manufactured as follows.

A stack of a first source/drain defining layer, a first channel defining layer, a body contact defining layer, a second channel defining layer and a second source/drain defining layer may be disposed on the substrate. The stack may be formed by an epitaxial growth. Accordingly, a thickness of each layer may be well controlled. Each layer in the stack may be in-situ doped during growth, so as to achieve desired doping characteristics. For example, the first source/drain defining layer and the second source/drain defining layer may be heavily doped to achieve the source/drain regions; the body contact layer may be lightly doped to achieve the body contact region; and the first channel defining layer and the second channel defining layer may be lightly doped or unintentionally doped. A crystal plane/doping interface may be provided between the layers grown/doped respectively.

The stack may have a vertical sidewall extending in a first direction. On the vertical sidewall, the active layer for defining the active region may be formed. The active layer may be formed by the epitaxial growth, and thus a thickness of the active layer and a thickness of the channel region thus defined may be well controlled. In addition, a material of the active layer may be appropriately selected according to an application. Since a next process (especially an etching process) is mainly performed for the above-mentioned stack, there may be a less restriction on a selection of the material of the active layer.

A dopant in the first source/drain defining layer, a dopant in the body contact defining layer and a dopant in the second source/drain defining layer may be respectively driven into corresponding portions of the active layer by, for example, a heat treatment, so as to form a lower source/drain region, a body contact region and an upper source/drain region respectively. The lower source/drain region, the body contact region and the upper source/drain region that are thus formed may be self-aligned with the first source/drain defining layer, the body contact defining layer and the second source/drain defining layer, respectively.

An isolation layer surrounding the above-mentioned stack may be formed, and a gate stack may be formed on the isolation layer after removing the first channel defining layer and the second channel defining layer. Accordingly, the gate stack may include a first gate stack and a second gate stack, and the first gate stack and the second gate stack are disposed on a first side and a second side which are opposite to each other in a second direction intersecting (e.g., perpendicular to) the first direction. The gate stack may overlap the channel region to effectively control the channel region.

The isolation layer may have a substantially flat top surface, so that the gate stack formed on the isolation layer may extend continuously around a periphery of the active region, so as to obtain a GAA configuration. Alternatively, the isolation layer has protrusion portions on two opposite sides of the stack in the first direction, so that the gate stacks formed on the isolation layer may be electrically isolated from each other through the protrusion portions, so as to obtain a multi-gate configuration.

In addition, the gate stack may be formed by a self-aligned process. For example, the first channel defining layer and the second channel defining layer may be relatively recessed at the vertical sidewall by a selective etching, so as to define a space for accommodating (at least part of an end portion of) the gate stack, and then the active layer may be formed. A dummy gate may be formed to maintain the space thus defined.

Some contact portions, such as an upper source/drain region contact portion to the upper source/drain region, a body contact portion to the body contact region, and a contact portion to the second gate stack (and optionally, a contact portion to a well region in the substrate) may be manufactured on the second side of the active layer, that is, the side where the above-mentioned stack is located.

The present disclosure may be presented in various forms, some examples of which will be described below. In the following descriptions, a selection of various materials is involved. In the selection of materials, in addition to a function of the material (for example, a semiconductor material is used for forming an active region, a dielectric material is used for forming an electrical isolation, a conductive material is used for forming an electrode, an interconnecting structure, etc.), an etching selectivity is also considered. In the following descriptions, a desired etching selectivity may or may not be indicated. It should be clear to those skilled in the art that when etching a material layer is mentioned below, if it is not mentioned or shown that other layers are also etched, then the etching may be selective, and the material layer may have an etching selectivity with respect to other layers exposed to the same etching recipe.

FIG. 1 to FIG. 13(c) show schematic diagrams of some stages in a process of manufacturing a semiconductor device according to an embodiment of the present disclosure.

As shown in FIG. 1, a substrate 1001 is provided. The substrate 1001 may be a substrate in various forms, including but not limited to a bulk semiconductor material substrate such as a bulk Si substrate, a semiconductor-on-insulator (SOI) substrate, a compound semiconductor substrate such as a SiGe substrate, etc. In the following descriptions, for ease of explanation, a bulk Si substrate, such as a Si wafer, is taken as an example for description.

A well region 1001w may be formed by, for example, an ion implantation in the substrate 1001. The well region 1001w may include a dopant of a certain conductivity type (e.g., for an n-type device, a p-type conductivity type; for a p-type device, an n-type conductivity type) and a certain concentration such as about $1E17$ $cm^{-3}$ to $1E19$ $cm^{-3}$. Many methods are provided in the art to provide the well region, which will not be repeated here.

A first source/drain defining layer 1003, a first channel defining layer 1005, a body contact defining layer 1007, a second channel defining layer 1009 and a second source/drain defining layer 1011 may be formed in sequence by, for example, an epitaxial growth on the substrate 1001. The layers grown on the substrate 1001 may be single crystal semiconductor layers and may have a crystal interface therebetween.

The first source/drain defining layer 1003 and the second source/drain defining layer 1011 may then define positions of the source/drain regions, and respective thicknesses thereof may be, for example, about 20 nm to 200 nm. The first source/drain defining layer 1003 and the second source/drain defining layer 1011 may be doped with a dopant of a certain conductivity type (e.g., for an n-type device, an n-type conductivity type; for a p-type device, a p-type conductivity type) and a certain concentration such as about $1E18$ $cm^{-3}$ to $1E21$ $cm^{-3}$, for example, by an in-situ doping during the growth.

The body contact defining layer 1007 may then define a position of the body contact, and a thickness thereof may be, for example, about 2 nm to 100 nm. In order to optimize a device performance such as an adjustment of a threshold voltage (Vt), the body contact defining layer 1007 may be doped with a dopant of a certain conductivity type (e.g., for an n-type device, a p-type conductivity type; for a p-type device, an n-type conductivity type) and a certain concentration such as about $1E17$ $cm^{-3}$ to $1E20$ $cm^{-3}$, for example, by an in-situ doping during the growth.

The first channel defining layer 1005 and the second channel defining layer 1009 may then define a position of the channel region along with the body contact defining layer 1007, and respective thicknesses thereof may be, for example, about 5 nm to 50 nm. In order to optimize the device performance such as the adjustment of Vt, at least one of the first channel defining layer 1005 and the second channel defining layer 1009 may be doped, for example, by an in-situ doping during the growth.

Since the layers are doped respectively, a doping concentration interface may be provided therebetween.

The first source/drain defining layer 1003, the first channel defining layer 1005, the body contact defining layer 1007, the second channel defining layer 1009, and the second source/drain defining layer 1011 may include various suitable semiconductor materials, such as an elemental semiconductor material such as Si or Ge, a compound semiconductor material such as SiGe, etc. In order to provide an appropriate etching selectivity in a subsequent process, an etching selectivity may be provided between adjacent layers among the layers. For example, in a case that the substrate 1001 is a Si wafer, the first source/drain defining layer 1003, the body contact defining layer 1007 and the second source/drain defining layer 1011 may include Si, while the first channel defining layer 1005 and the second channel defining layer 1009 may include SiGe (an atomic percentage of Ge is, for example, about 10% to 30%).

Figure 2:
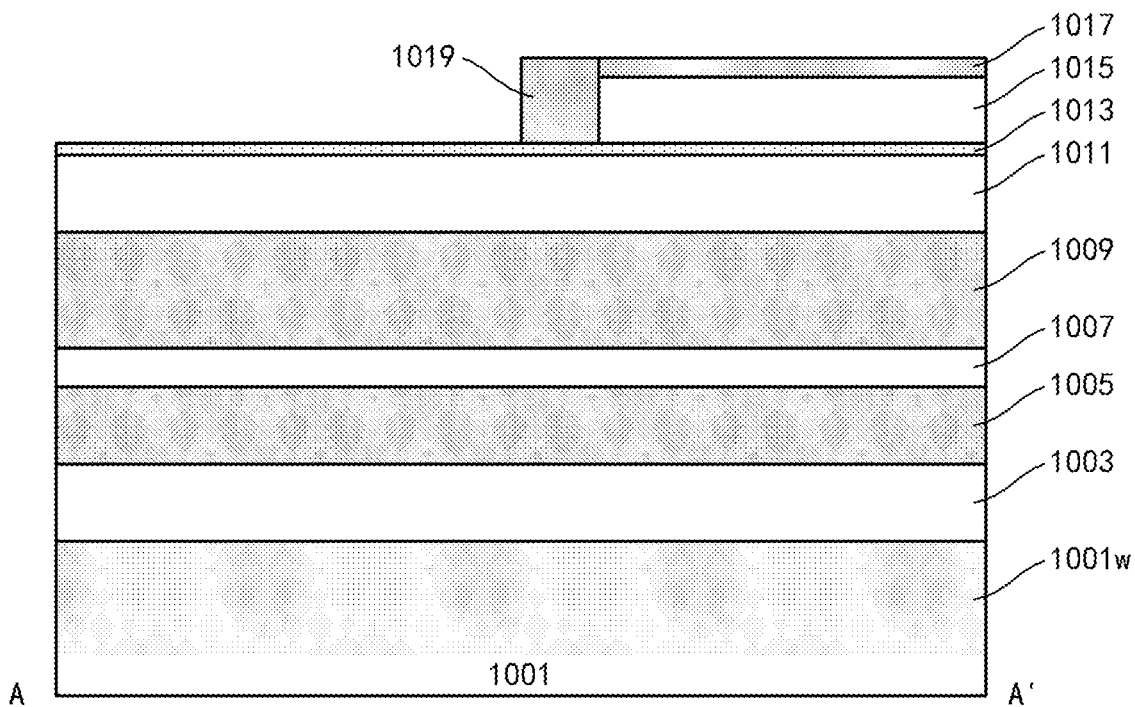

In order to facilitate a patterning, as shown in FIG. 2, an etch stop layer 1013, a mandrel layer 1015 and a hard mask layer 1017 may be formed in sequence on the stack of semiconductor layers, for example, by deposition. For example, the etch stop layer 1013 may include an oxide (e.g., a silicon oxide) with a thickness of about 2 nm to 15 nm; the mandrel layer 1015 may include amorphous silicon or polysilicon with a thickness of about 50 nm to 200 nm; and the hard mask layer 1017 may include a nitride (e.g., a silicon nitride) with a thickness of about 20 nm to 100 nm.

A photoresist (not shown) may be formed on the hard mask layer 1017, and patterned by photolithography to have a vertical sidewall extending in a first direction (a direction perpendicular to a paper surface in FIG. 2). The hard mask layer 1017 and the mandrel layer 1015 are selectively etched in sequence by, for example, a reactive ion etching (RIE) by using the patterned photoresist as an etching mask, and a pattern of the photoresist is transferred into the hard mask layer 1017 and the mandrel layer 1015. The RIE may proceed in a vertical direction. The etching may stop at the etch stop layer 1011. After that, the photoresist may be removed. Accordingly, the mandrel layer 1015 (and the hard mask layer 1017) may have the vertical sidewall extending in the first direction.

A spacer 1019 may be formed on the sidewall. For example, a layer of a nitride with a thickness of about 5 nm to 50 nm may be deposited in a substantially conformal manner, and then an anisotropic etching such as RIE (which may stop at the etch stop layer 1013) may be performed on the deposited nitride layer in the vertical direction, so as to remove a lateral extension portion of the deposited nitride layer and retain a vertical extension portion of the deposited nitride layer, so that the spacer 1019 may be obtained. The spacer 1019 may then be used to at least partially define a size of the upper source/drain region contact layer.

In FIG. 2, for convenience, a possible curved shape of a top end of the spacer 1019 due to the RIE is not shown. The curved shape (if any) may not affect the subsequent process. The same applies to the spacer shown below.

Figure 3A:
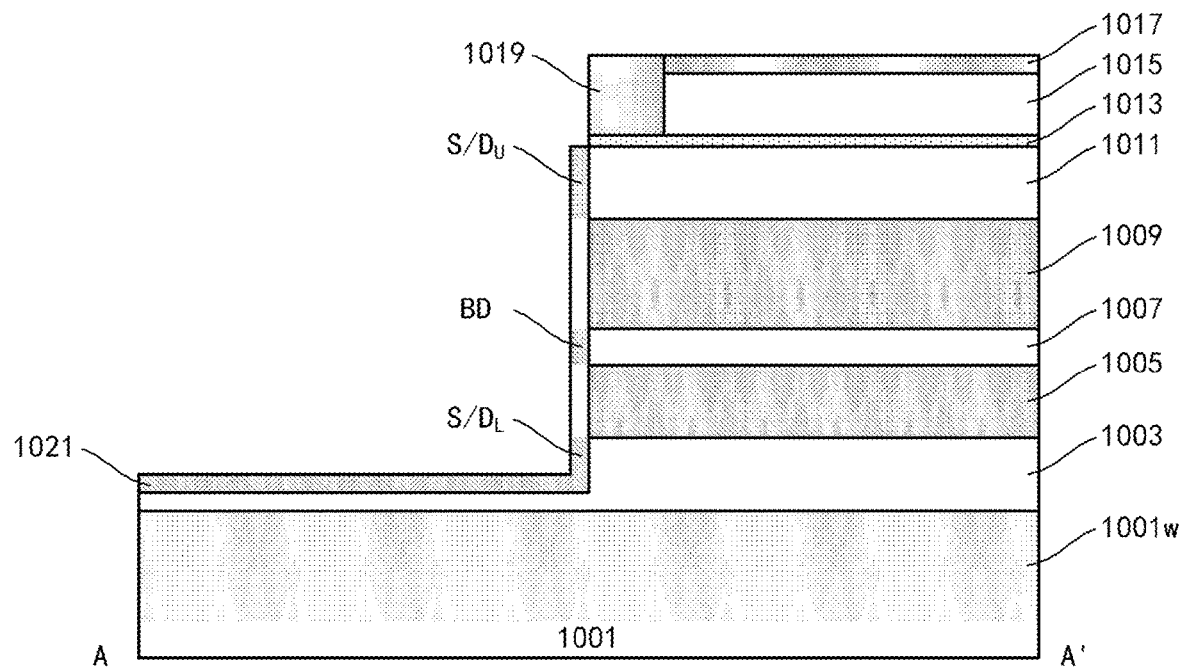

As shown in FIG. 3(a), (the etch stop layer 1013 and) the second source/drain defining layer 1011, the second channel defining layer 1009, the body contact defining layer 1007, the first channel defining layer 1005 and the first source/drain defining layer 1003 may be selectively etched in sequence by, for example, RIE by using the spacer 1019 and the hard mask layer 1017 as etching masks, so that the stack of semiconductor layers may have a vertical sidewall extending in the first direction as a growth surface of the active layer. The RIE may proceed in the vertical direction, and may not proceed into a bottom surface of the first source/drain defining layer 1003, but stop in the first source/drain defining layer 1003.

An active layer 1021 may be formed by, for example, a selective epitaxial growth on the vertical sidewall of the stack of semiconductor layers. The active layer 1021 may include various suitable semiconductor materials, such as an elemental semiconductor material such as Si, a compound semiconductor material such as III-V compound semiconductor, SiC, etc. The active layer 1021 may then define the channel region with a thickness of, for example, about 3 nm to 20 nm. According to embodiments of the present disclosure, the thickness of the active layer 1021 (and thus, the channel region) may be determined by an epitaxial growth process, so that a thickness of the channel region may be better controlled and a thickness fluctuation may be reduced.

A dopant may be driven into the active layer 1021 from the first source/drain defining layer 1003 and the second source/drain defining layer 1011 by annealing, so as to form doping regions as a lower source/drain region $S/D_L$ and an upper source/drain region $S/D_U$ in regions corresponding to the first source/drain defining layer 1003 and the second source/drain defining layer 1011 in the active layer 1021, respectively. A dopant (if exists) is driven into the active layer 1021 from the body contact defining layer 1017, so as to form a doping region as a body contact region BD in a region corresponding to the body contact defining layer 1017 in the active layer 1021. In addition, if dopants also exist in the first channel defining layer 1005 and/or the second channel defining layer 1009, the dopants may also be driven into corresponding regions in the active layer 1021 during an annealing process.

Here, a condition (e.g., annealing time) of the annealing process may be controlled, so that a diffusion degree of dopants from the first source/drain defining layer 1003, the second source/drain defining layer 1011 and the body contact defining layer 1017 into the active layer 1021 may be equivalent to the thickness of the active layer 1021. In this way, positions of the lower source/drain region $S/D_L$, the body contact region BD and the upper source/drain region $S/D_U$ in the vertical direction may be defined by the first source/drain defining layer 1003, the body contact defining layer 1007 and the second source/drain defining layer 1011, respectively. Accordingly, a position of the channel region between the lower source/drain region $S/D_L$ and the upper source/drain region $S/D_U$ may be defined by the first channel defining layer 1005, the body contact defining layer 1007 and the second channel defining layer 1009. That is, a length of the channel region may be determined by thicknesses of the first channel defining layer 1005, the body contact defining layer 1007 and the second channel defining layer 1009, and the thicknesses of the first channel defining layer 1005, the body contact defining layer 1007 and the second channel defining layer 1009 may be determined by the epitaxial growth process, so the length of the channel region may be better controlled.

In this example, the upper source/drain region $S/D_U$ and the lower source/drain region $S/D_L$ may have a same conductivity type, and the body contact region BD may have a different conductivity type therefrom. However, the present disclosure is not limited thereto. For example, the upper source/drain region $S/D_U$ and the lower source/drain region $S/D_L$ may have different conductivity types (and thus a tunneling device may be formed, for example), and the body contact region BD may have a different conductivity type from one of the above conductivity types.

In FIG. 3(a), for convenience of understanding, the lower source/drain region $S/D_L$, the body contact region BD and the upper source/drain region $S/D_U$ are shown by shadows. In the following drawings, the doping regions will not be shown separately for convenience and clarity.

According to embodiments of the present disclosure, a size and a relative position in the vertical direction of the body contact region BD may be adjusted by controlling the thickness of at least one of the first channel defining layer 1005, the body contact defining layer 1007 and the second channel defining layer 1009. For example, in a case that the thicknesses of the first channel defining layer 1005 and the second channel defining layer 1009 are substantially the same, the body contact region BD may be located at a substantially middle portion of the channel region in the vertical direction. Alternatively, in a case that the thicknesses of the first channel defining layer 1005 and the second channel defining layer 1009 are different from each other, the body contact region BD may be close to the lower source/drain region $S/D_L$ (for example, in a case that the first channel defining layer 1005 is thinner than the second channel defining layer 1009) or the upper source/drain region $S/D_U$ (for example, in a case that the first channel defining layer 1005 is thicker than the second channel defining layer 1009).

In this example, the first source/drain defining layer 1003 has a portion extending beyond a region defined by the spacer 1019 and the hard mask layer 1017. Therefore, the active layer 1021 is also grown on the portion, and thus has a lateral extension portion. The lateral extension portion of the active layer 1021 is doped due to a diffusion of the dopant in the first source/drain defining layer 1003 located below in the annealing process, and thus may be used as a part of the lower source/drain region $S/D_L$. The lateral extension portion of the lower source/drain region $S/D_L$ may help to land a subsequently formed contact portion to the lower source/drain region $S/D_L$ thereon.

Figure 3B:
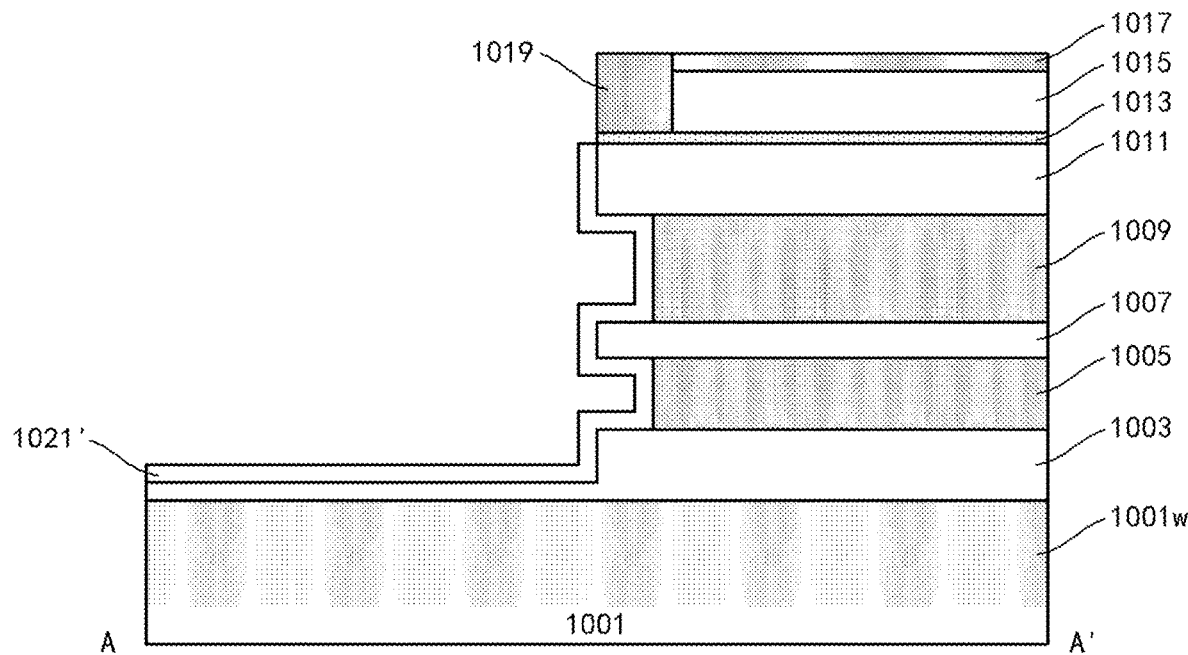

According to another embodiment of the present disclosure, in order to achieve a self-aligned gate, as shown in FIG. 3(b), after the vertical sidewall is patterned in the stack of semiconductor layers by using the spacer 1019 and the hard mask layer 1017 as described above in connection with FIG. 3(a), the first channel defining layer 1005 and the second channel defining layer 1009 may be relatively recessed in a lateral direction by the selective etching. In order to control an etching depth, an atomic layer etching (ALE) may be used.

Here, due to the etching selectivity, the body contact defining layer 1007 protrudes with respect to the first channel defining layer 1005 and the second channel defining layer 1009. However, the present disclosure is not limited thereto. For example, the first channel defining layer 1005, the second channel defining layer 1009 and the body contact defining layer 1007 may be relatively recessed using an etching recipe capable of selectively etching the first channel defining layer 1005, the second channel defining layer 1009 and the body contact defining layer 1007 (with respect to the first source/drain defining layer 1003 and the second source/drain defining layer 1011) by selecting an appropriate material, so that a space for the gate stack may be defined.

After that, an active layer 1021' may be similarly grown and a dopant may be driven therein. For the active layer 1021' and the dopant drive-in, please refer to the above descriptions of the active layer 1021 and the dopant drive-in, except that the active layer 1021' may have a curved shape due to a relative recess of the first channel defining layer 1005 and the second channel defining layer 1009.

Figure 4:
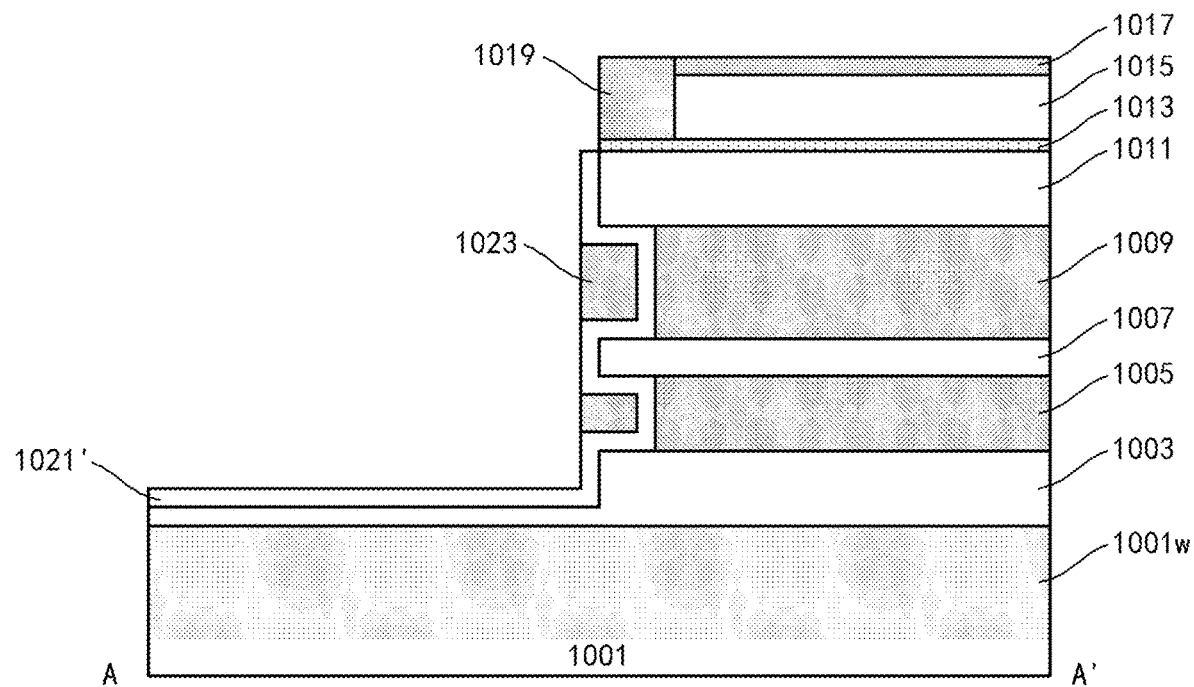

In the recesses of end portions of the first channel defining layer 1005 and the second channel defining layer 1009 (and optionally, the body contact defining layer 1007), as shown in FIG. 4, a dummy gate 1023 may be formed by, for example, deposition and RIE in the vertical direction. Considering the etching selectivity, the dummy gate 1023 may include, for example, SiC.

Embodiments of FIG. 3(*a*) will be mainly taken as an example for description below. The descriptions generally also apply to embodiments of FIG. 3(*b*), and separate descriptions of embodiments of FIG. 3(*b*) are provided if necessary.

Figure 5A:
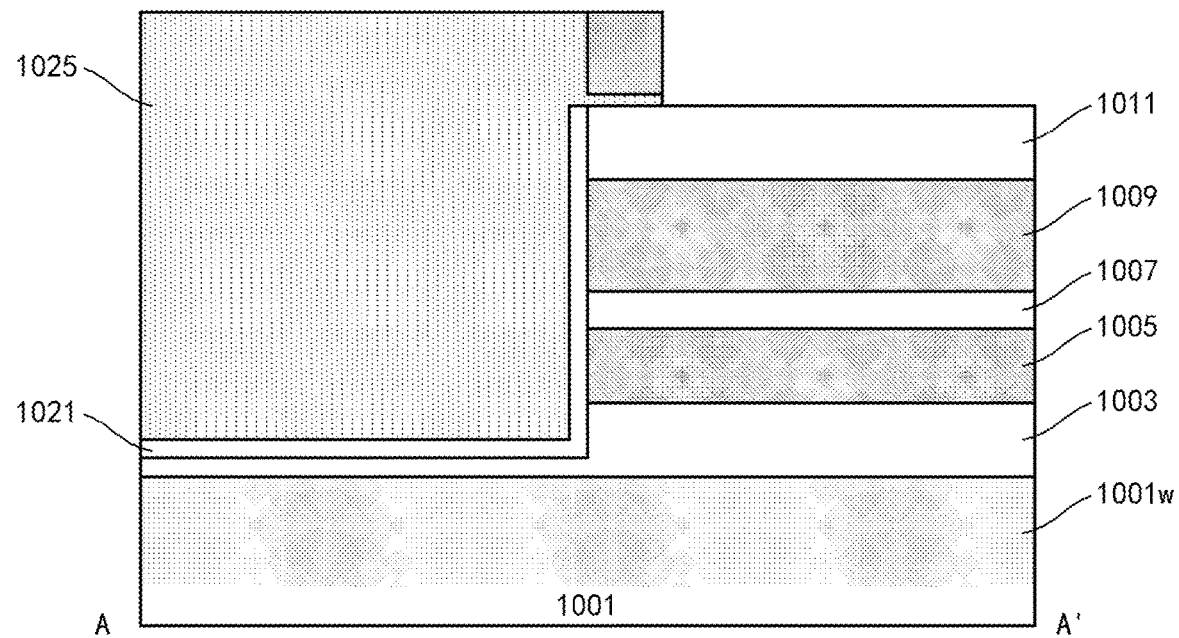
Figure 5B:
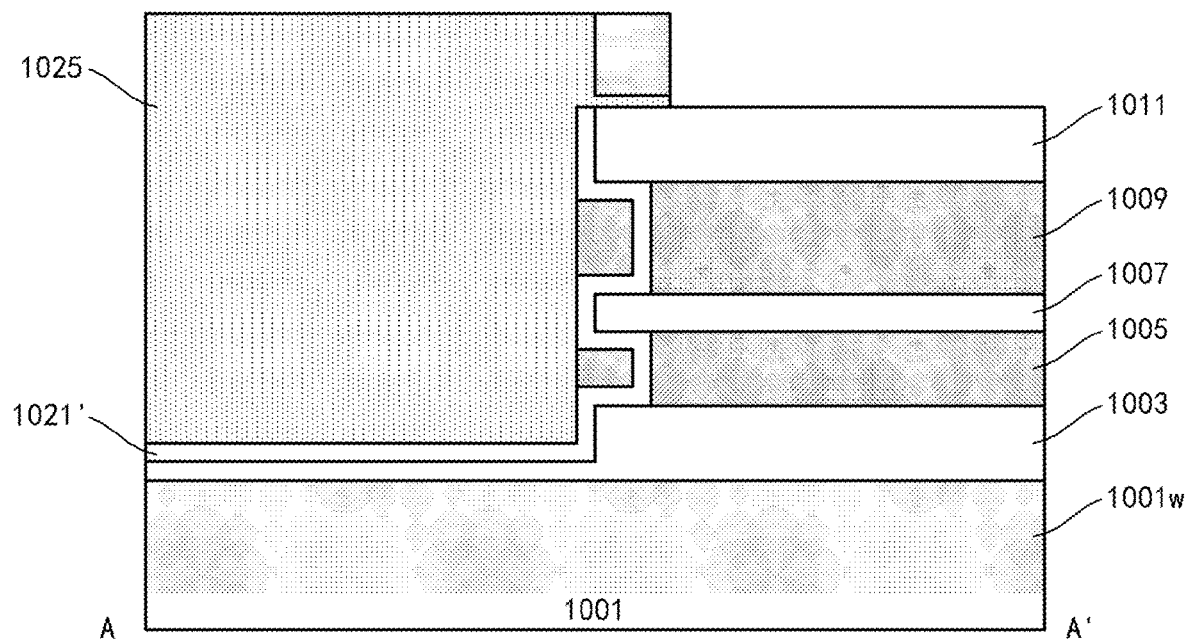

As shown in FIG. 5(*a*) and FIG. 5(*b*), a shielding layer 1025 may be formed to shield the active layers 1021 and 1021'. For example, the shielding layer 1025 may be formed by forming, on the substrate 1001, an oxide layer completely covering a structure that has formed on the substrate 1001 by deposition, and performing a planarization process, such as chemical mechanical polishing (CMP, which may stop at the hard mask layer 1017 of the nitride and/or the spacer 1019), on the deposited oxide layer.

In a case that the active layers 1021 and 1021' are shielded by the shielding layer 1025, the above-mentioned stack of semiconductor layers may be patterned, so that a landing pad for some contact portions may be defined on a side (a right side in the drawings) of the active layers 1021 and 1021'. For example, the hard mask layer 1017 may be removed by the selective etching, such as RIE in the vertical direction, to expose the mandrel layer 1015. Here, the spacer 1019, which is the same nitride as the hard mask layer 1017, may be retained due to a thicker thickness of the spacer 1019. The mandrel layer 1015 and the etch stop layer 1013 may be removed in sequence by the selective etching, such as the RIE in the vertical direction, to expose the second source/drain defining layer 1011. Here, a remaining portion of the etch stop layer 1013 and the shielding layer 1025, which is also an oxide, are shown as a whole.

In this way, the stack of semiconductor layers may be exposed on the side (the right side in the drawings) of the active layers 1021 and 1021', so as to facilitate a patterning thereof.

Here, the spacer 1019 covers a part of the second source/drain defining layer 1011, and the portion of the second source/drain defining layer 1011 covered by the spacer 1019 may define a landing pad of a contact portion to the upper source/drain region S/D$_U$.

Next, a landing pad of a contact portion to the body contact region BD may be defined.

Figure 6:
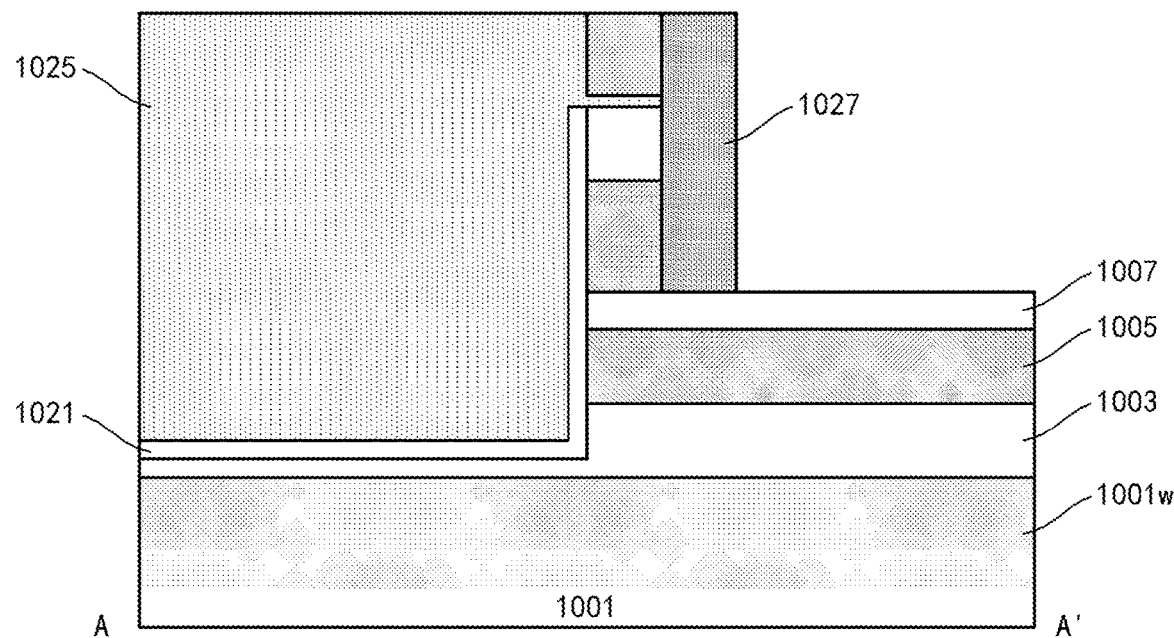

For example, as shown in FIG. 6, the second source/drain defining layer 1011 and the second channel defining layer 1009 may be etched in sequence by, for example, RIE in the vertical direction by using the spacer 1019 as an etching mask, so as to expose the body contact defining layer 1007. Accordingly, the body contact defining layer 1007 may protrude with respect to the second source/drain defining layer 1011 located above, and the protrusion portion may define the landing pad of the contact portion to the body contact region BD.

According to some embodiments, a contact portion to the well region 1001*w* in the substrate 1001 may also be manufactured. In this case, in order to expose the well region 1001*w* located below, a spacer 1027 may be formed on the body contact defining layer 1007 to define the landing pad of the contact portion to the body contact region BD, which is similar to defining the landing pad of the contact portion to the upper source/drain region S/D$_U$ by using the spacer 1019. The spacer 1027 may be formed by the process as described above for the spacer 1019. Considering the etching selectivity, a spacer 1035 may include SiC. A portion of the body contact defining layer 1007 covered by the spacer 1027 may define the landing pad of the contact portion to the body contact region BD.

Figure 7:
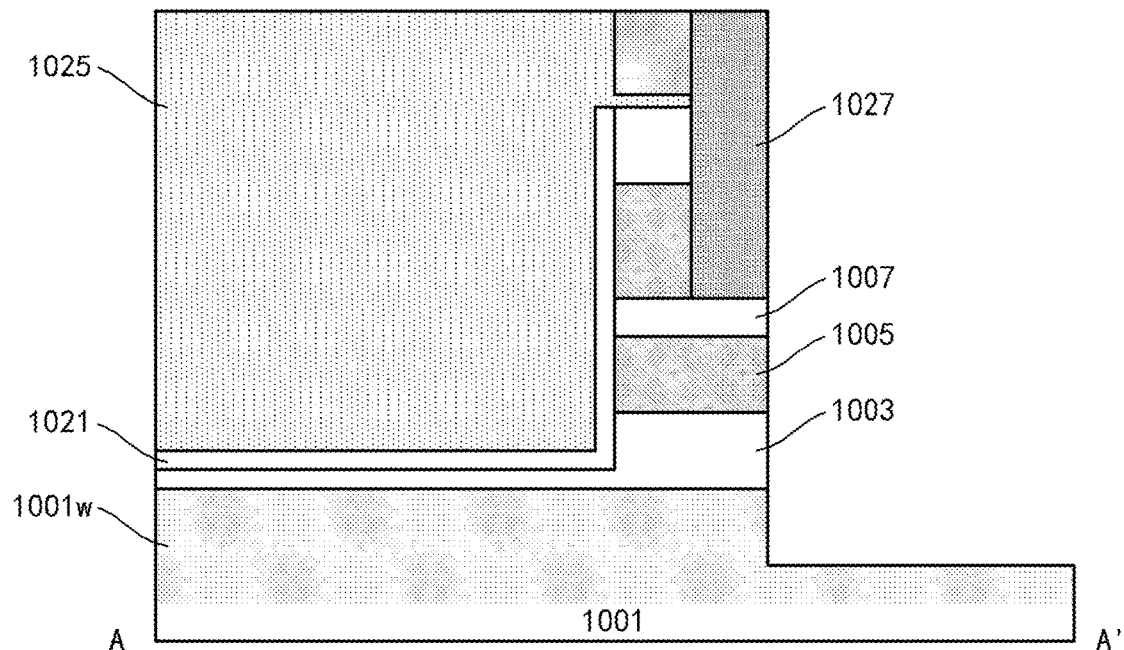

Then, as shown in FIG. 7, the body contact defining layer 1007, the first channel defining layer 1005 and the first source/drain defining layer 1003 may be etched in sequence by, for example, the RIE in the vertical direction by using the spacer 1027 (as well as the spacer 1019 and the shielding layer 1025) as an etching mask, so as to expose the well region 1001*w*. In this example, since both the first source/drain defining layer 1003 and the substrate 1001 include Si, the etching of the first source/drain defining layer 1003 may proceed into the well region 1001*w*. After that, the spacer 1027 may be removed by the selective etching.

Figure 8A:
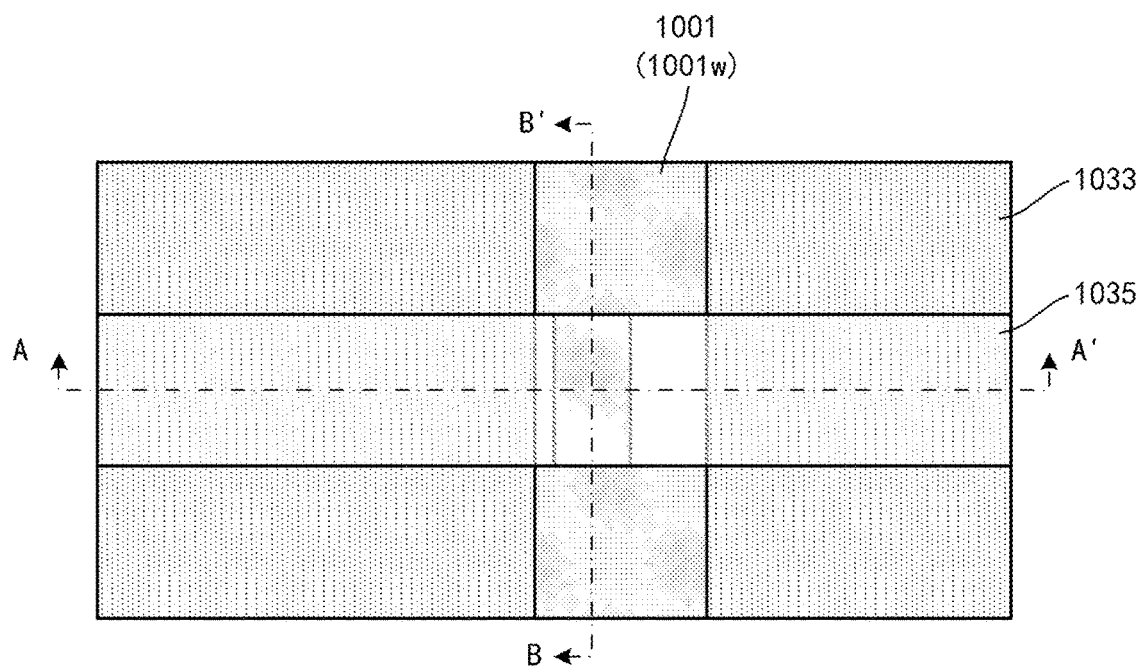
Figure 8B:
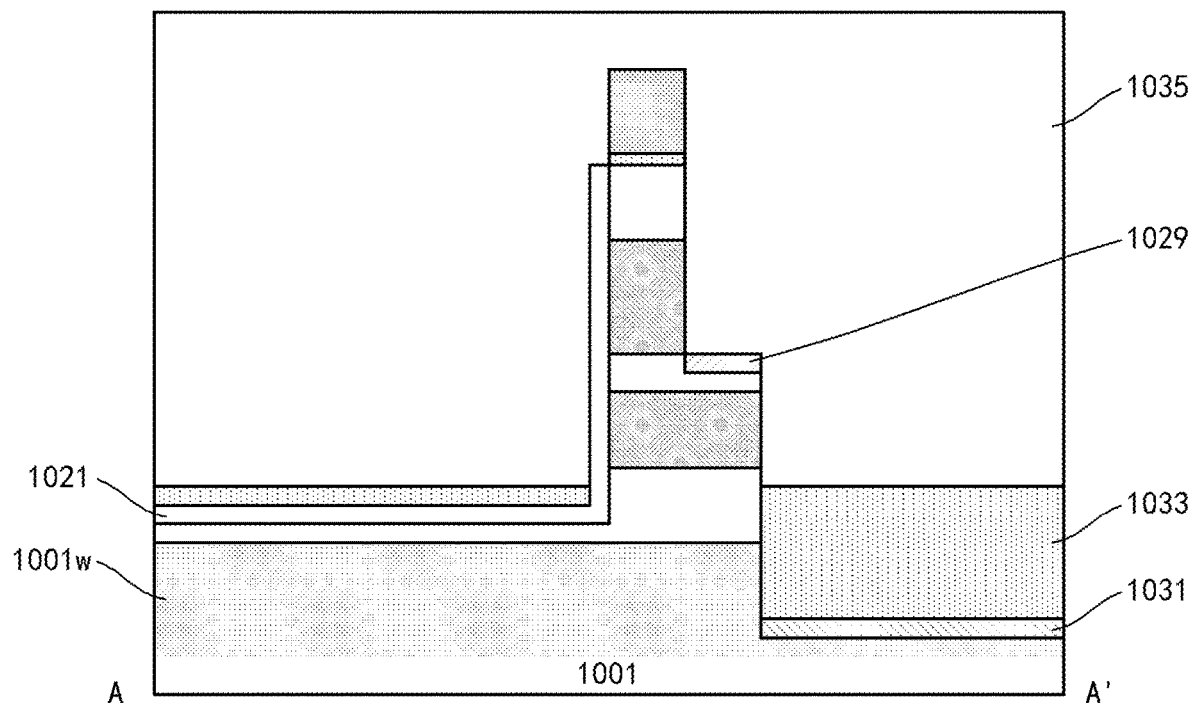

In addition, in order to reduce a contact resistance, an ion implantation in the vertical direction and annealing may be performed to form relatively highly doped contact regions (see 1029 and 1031 in FIG. 8(*b*)) (a conductivity type of which is the same as conductivity types of the body contact defining layer 1007 and the well region 1001*w*) in the body contact defining layer 1007 and the well region 1001*w*, respectively.

At this point, the stack of semiconductor layers and the active layer 1021 formed on a vertical sidewall thereof may extend continuously in the first direction. They may be patterned into different sections for individual devices.

As shown in FIG. 8(*a*), FIG. 8(*b*) and FIG. 8(*c*), an oxide layer completely covering the structure that has formed on the substrate 1001 may be formed on the substrate 1001 by deposition, and the planarization process, such as CMP (the CMP may stop at the spacer 1019 of the nitride) may be performed on the deposited oxide layer. In this way, oxide layers (the previously formed shielding layer 1025 on the left and the newly deposited oxide layer on the right) are formed on two opposite sides (left and right sides in the drawings) of the stack of semiconductor layers and the active layer 1021 extending in the first direction. Then, the oxide layer is etched back by, for example, the RIE in the vertical direction, so as to form an isolation layer 1033. A thickness of the isolation layer 1033 may cause regions (i.e., regions corresponding to the first channel defining layer 1005, the body contact defining layer 1007 and the second channel defining layer 1009) of the channel region in the active layer 1021 to be exposed, for example, a top surface of the isolation layer 1033 may not be higher than, preferably (slightly) lower than a bottom surface of the first channel defining layer 1005.

A photoresist 1035 may be formed on the isolation layer 1033, and patterned into a strip extending in a second direction (a horizontal direction within a paper surface in a top view of FIG. 8(a)) intersecting (e.g., perpendicular to) the first direction (a vertical direction within the paper surface in the top view of FIG. 8(a)). Based on the photoresist 1035, the stack of semiconductor layers and the active layer 1021 may be cut into different sections separated in the first direction (only one of the sections is shown in the drawings, that is, a section covered by the photoresist 1035) by, for example, the RIE in the vertical direction, so as to define active regions of different devices. The RIE may proceed into the substrate 1001. After that, the photoresist 1035 may be removed.

In the top view of FIG. 8(a), intercepting positions of line AA' and line BB' of cross-sectional views in other drawings are also schematically shown.

Figure 8C:
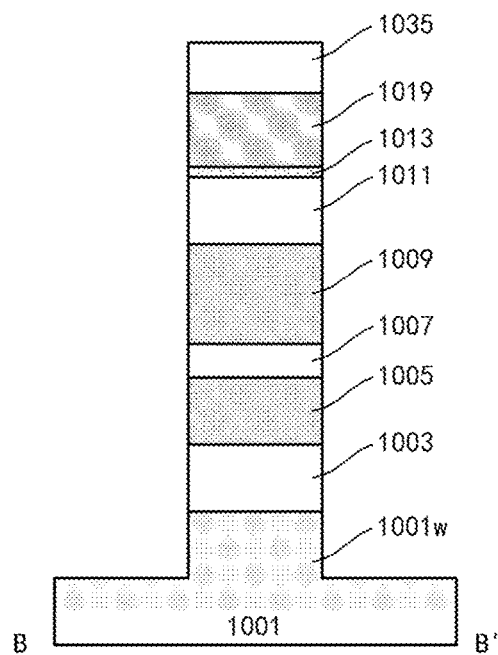
Figure 9A:
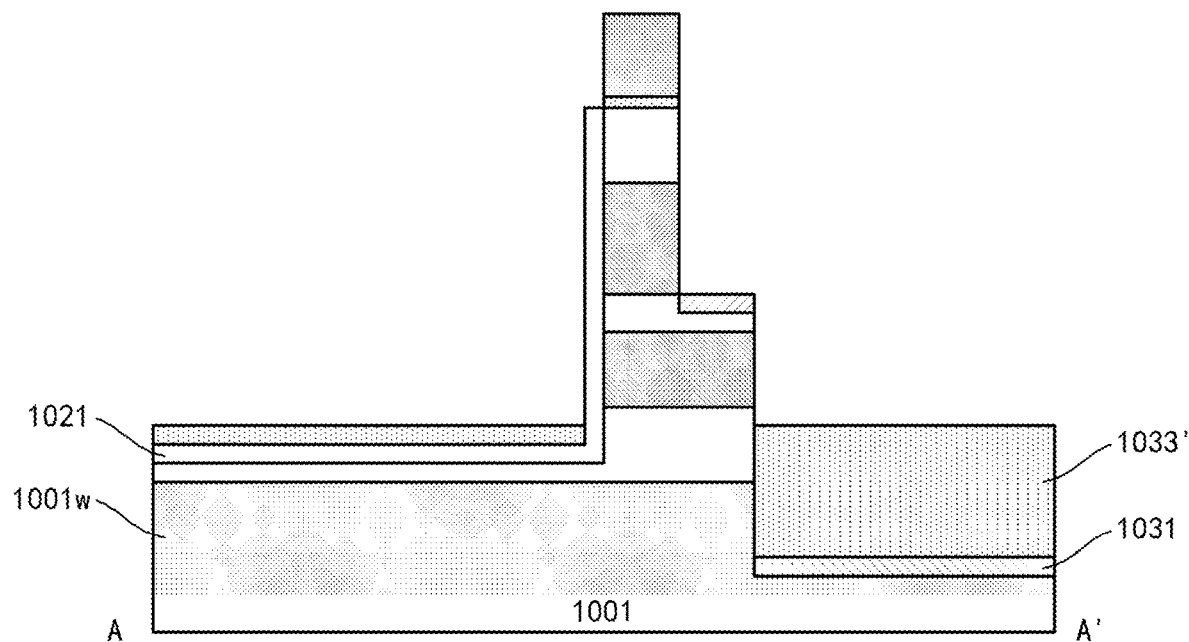
Figure 9B:
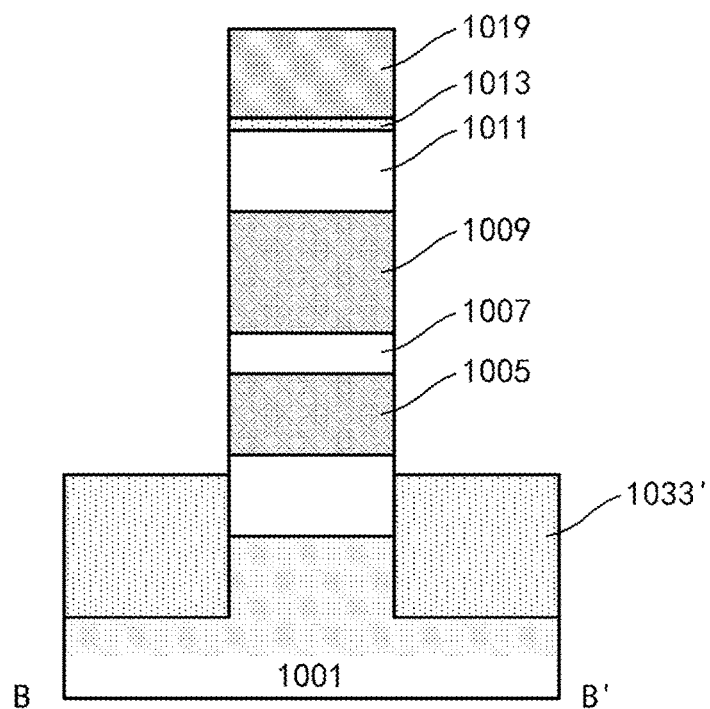

In addition, at present, the isolation layers 1033 are provided on left and right sides of each section, and a dielectric material such as an oxide may also be formed in a groove (a cut region between sections, see FIG. 8(c)) formed by cutting, so that an isolation layer surrounding each section may be formed along with the isolation layer 1033. For example, as shown in FIG. 9(a) and FIG. 9(b), an isolation layer 1033' may be formed by depositing, planarizing and etching back the oxide by a method similar to the method of forming the isolation layer 1033. Here, the isolation layer around each section (including a remaining portion of the previously formed isolation layer 1033) is shown as 1033' together. Similarly, a thickness of the isolation layer 1033' may cause the region of the channel region in the active layer 1021 to be exposed, for example, a top surface of the isolation layer 1033' may not be higher than, and preferably (slightly) lower than the bottom surface of the first channel defining layer 1005.

In this example, each section protrudes with respect to the isolation layer 1033' around each section, so that a gate stack subsequently formed on the isolation layer 1033' may surround a periphery of each section (especially the channel region therein), so as to obtain the GAA configuration.

Figure 10:
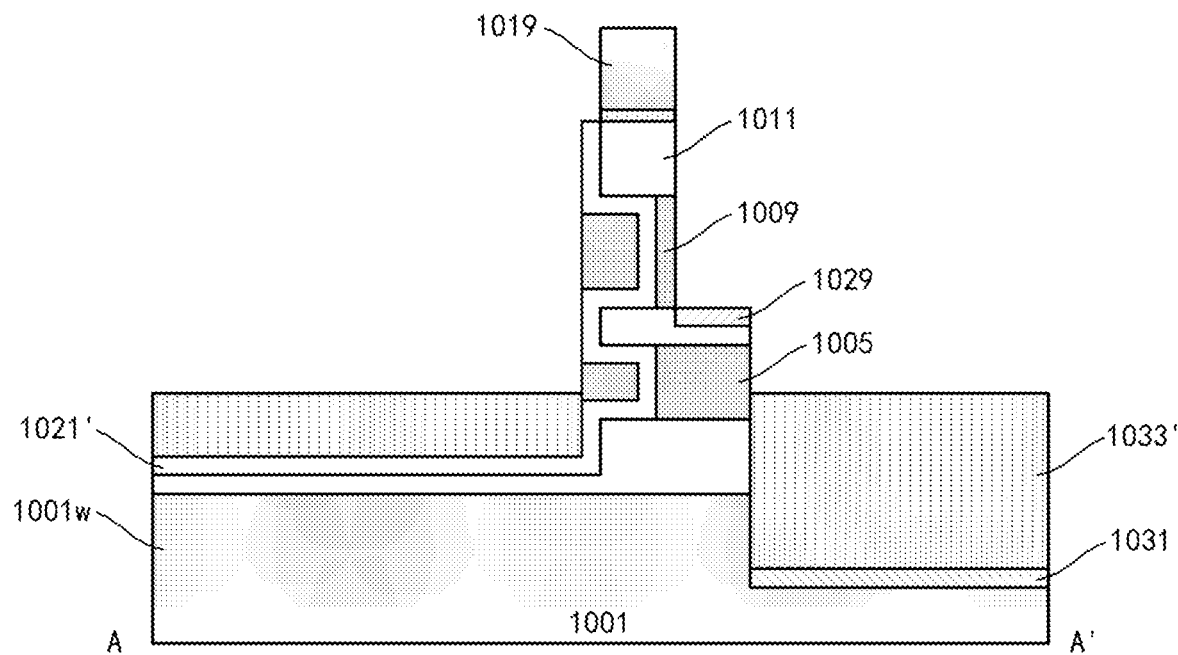

FIG. 10 shows the isolation layer 1033' in a case of embodiments shown in FIG. 3(b) and FIG. 4. In this case, the top surface of the isolation layer 1033' may be higher than the bottom surface of the first channel defining layer 1005. This is because a lower end of the channel region may not blocked by the isolation layer 1033' (although the top surface of which is higher) due to an existence of the dummy gate 1023.

Figure 11A:
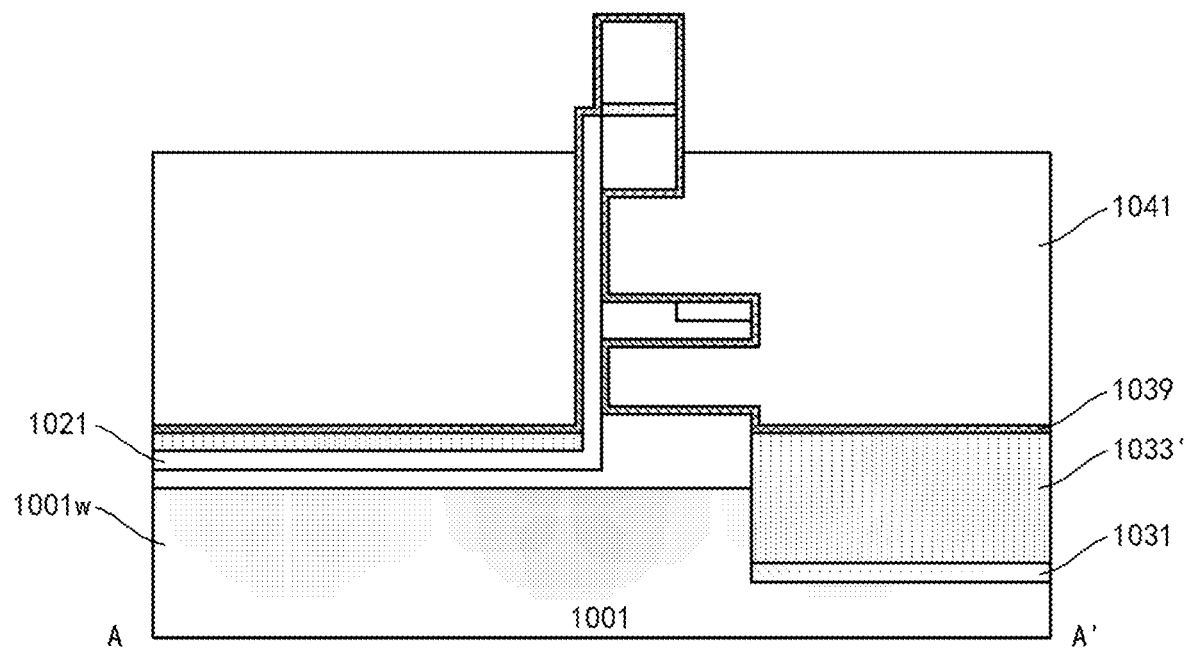

As shown in FIG. 11(a), the first channel defining layer 1005 and the second channel defining layer 1009 may be removed by the selective etching. In this way, the active layer 1021 may also be exposed on the right side. A gate stack may be formed on the isolation layer 1033'. The gate stack may include a gate dielectric layer 1039 and a gate conductor layer 1041. For example, the gate dielectric layer 1039 may include a high-k dielectric (such as $HfO_2$) layer with a thickness of about 1 nm to 10 nm formed by, for example, deposition. The gate dielectric layer 1039 may be formed in a substantially conformal manner. Before forming the gate dielectric layer 1039, a thin interface layer, such as an oxide of about 0.3 nm to 2 nm, may also be formed by, for example, oxidation or deposition. The gate conductor layer 1041 may include a work function layer such as TiN, TiAlN, a material containing Zr, Ru or La, etc., and may further include a conductive material layer such as W, etc. as required. The gate conductor layer 1041 may be etched back, so that a top surface of the gate conductor layer 1041 may be higher than a bottom surface of the second source/drain defining layer 1011 to ensure an overlap with the channel region (however, the top surface of the gate conductor layer 1041 should not be too high, so as to reduce an overlap with the upper source/drain region $S/D_U$ corresponding to the second source/drain defining layer 1011).

The gate stack (1039/1041) thus formed is not self-aligned, and thus may have a certain overlap with the lower source/drain region $S/D_L$ and/or the upper source/drain region $S/D_U$.

Figure 11B:
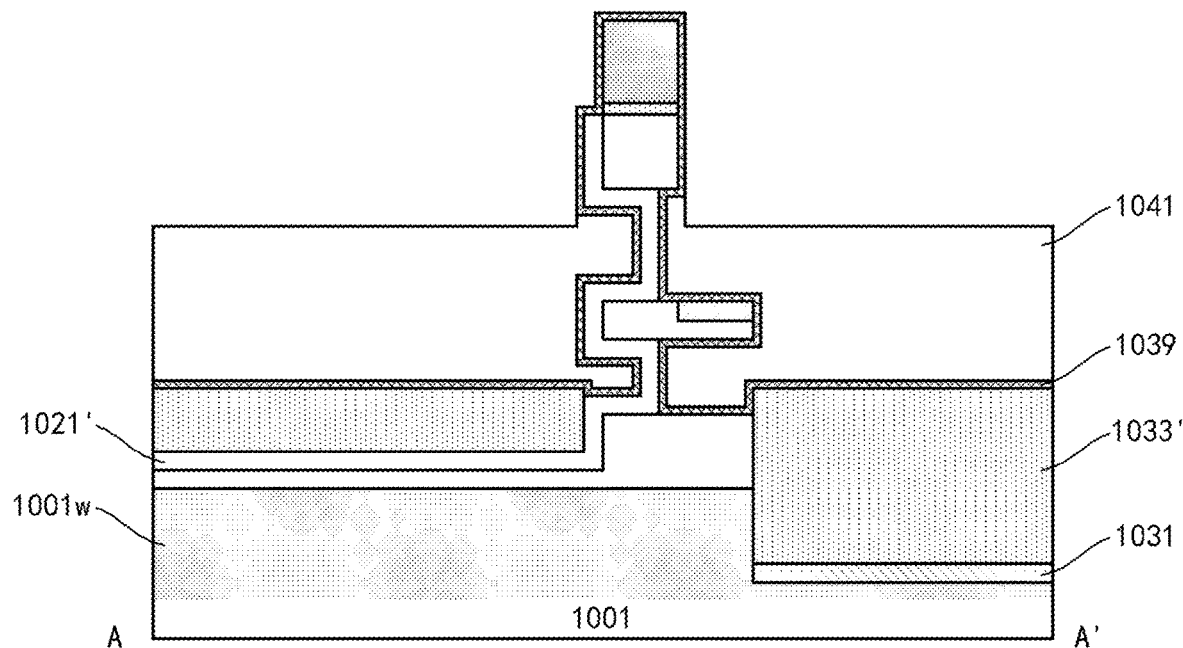

In another embodiment as described above in connection with FIG. 3(b) and FIG. 4, the gate stack may be self-aligned with the channel region in the active layer 1021'. For example, as shown in FIG. 11(b), the gate stack (1039/1041) formed on the isolation layer 1033' may enter a space previously occupied by the dummy gate 1023 so as to overlap the channel region in the active layer 1021'.

In this example, the gate conductor layer 1041 may be etched back so that the top surface of the gate conductor layer 1041 is lower than the bottom surface of the second source/drain defining layer 1011. In addition, due to the setting of the top surface of the isolation layer 1033' as described above, an end portion of the gate stack close to the active layer 1021' is defined by the dummy gate 1023, and a position of the dummy gate 1023 is defined by the first channel defining layer 1005 and the second channel defining layer 1009 themselves. Therefore, the gate stack may be self-aligned with the channel region in the active layer 1021'.

Next, various contact portions may be manufactured. According to embodiments of the present disclosure, in addition to manufacturing the contact portions to the source/drain region and the gate stack of the device, the contact portion to the body contact region may also be manufactured.

At present, the gate stack is exposed. The gate stack (especially the gate conductor layer therein) may be appropriately patterned, so as not to affect a formation of other contact portions. For example, on the left side, the gate conductor layer may be appropriately retracted, so as not to interfere with a subsequently formed contact portion to the first source/drain defining layer 1003; on the right side, the gate conductor layer may be appropriately retracted, so as not to interfere with a subsequently formed contact portion to the body contact defining layer 1017.

Figure 12A:
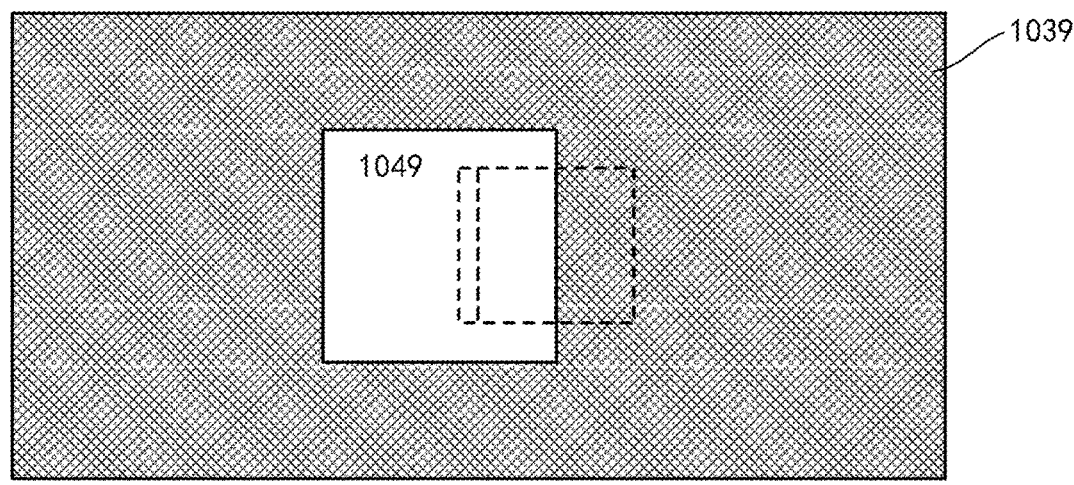
Figure 12B:
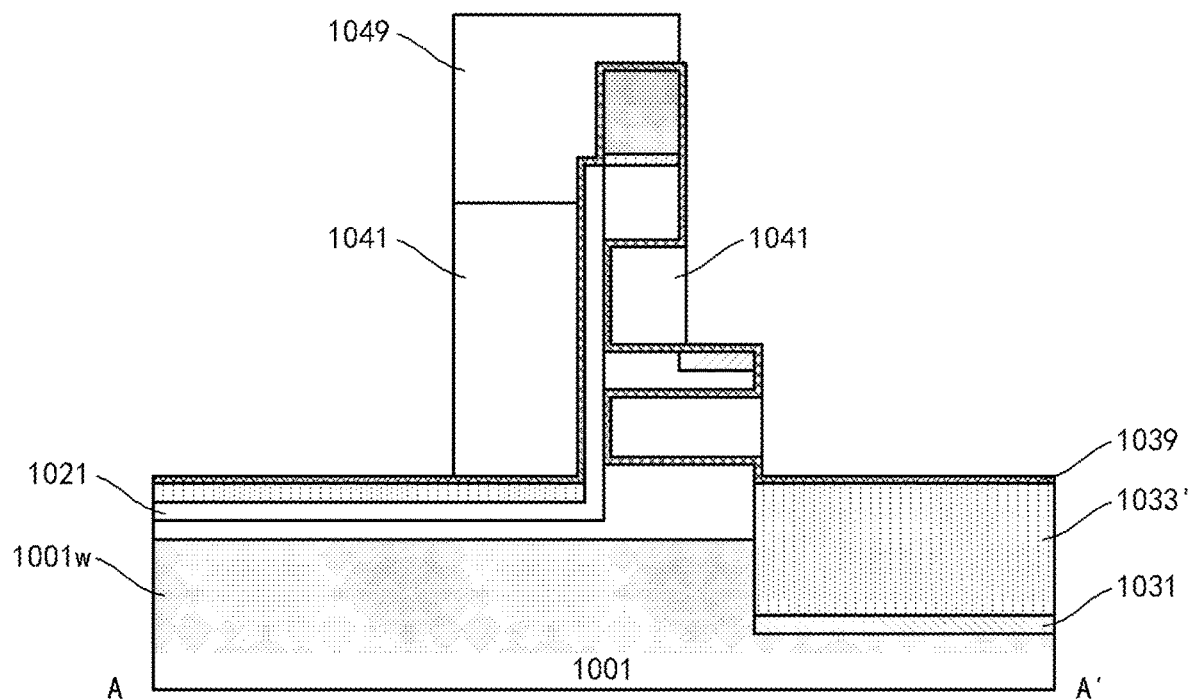

For example, as shown in FIG. 12(a) and FIG. 12(b), a photoresist 1049 may be formed on the gate conductor layer, and patterned so as to surround a periphery of the channel region (as schematically shown by a relatively small dashed rectangular frame in FIG. 12(a)) in a plan view (see FIG. 12(a)). In addition, a right boundary of the photoresist 1049 may be shifted to the left with respect to a right boundary of the spacer 1019 in the plan view, so that the spacer 1019 (a portion not overlapping the photoresist 1049) may be used as an/a (part of) etching mask. In this way, in the plan view, the landing pad (as schematically shown by a dashed rectangular frame outside the photoresist 1049 in FIG. 12(a)) of the contact portion to the body contact region BD previously defined by the spacer 1027 in the body contact defining layer 1007 may not overlap the photoresist 1049.

The gate conductor layer 1041 may be etched by the selective etching, such as the RIE in the vertical direction, by using the photoresist 1049 thus patterned and the above-mentioned spacer 1019 as etching masks. The etching of the gate conductor layer 1041 may stop at the gate dielectric layer 1039. Accordingly, the gate conductor layer 1041 may be formed in a shape surrounding the active layer 1021 (especially the channel region therein), and thus the GAA configuration may be obtained. Moreover, the gate conductor layer 1041 may be removed from a portion of the body contact defining layer 1017 used to define the landing pad of the contact portion to the body contact region BD. After that, the photoresist 1049 may be removed.

In a top view of FIG. 12(*a*), a possible fluctuation of the gate dielectric layer 1039 due to a fluctuation of an underlying structure is not shown for convenience only. The same applies in top views below.

Figure 13A:
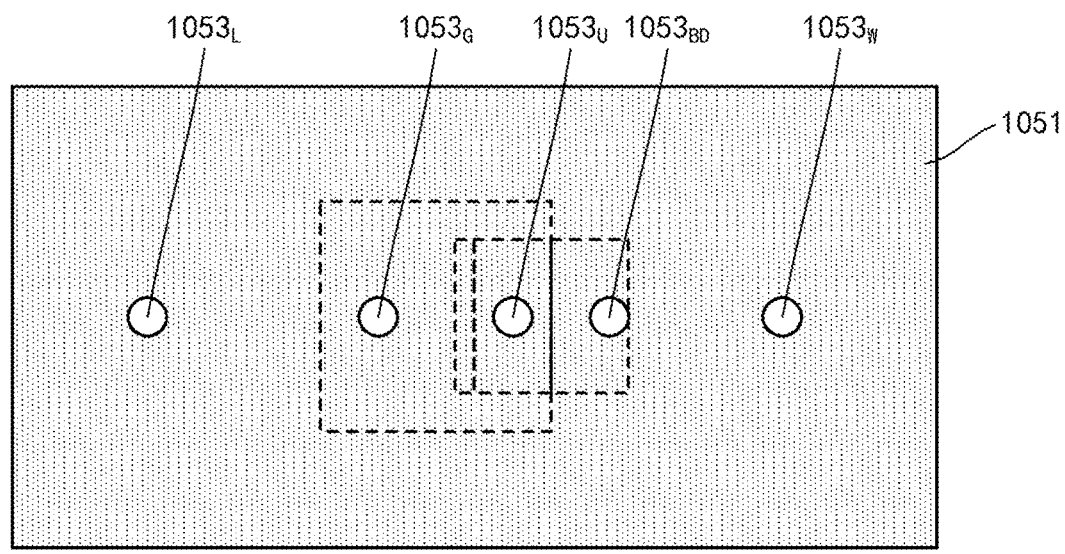
Figure 13B:
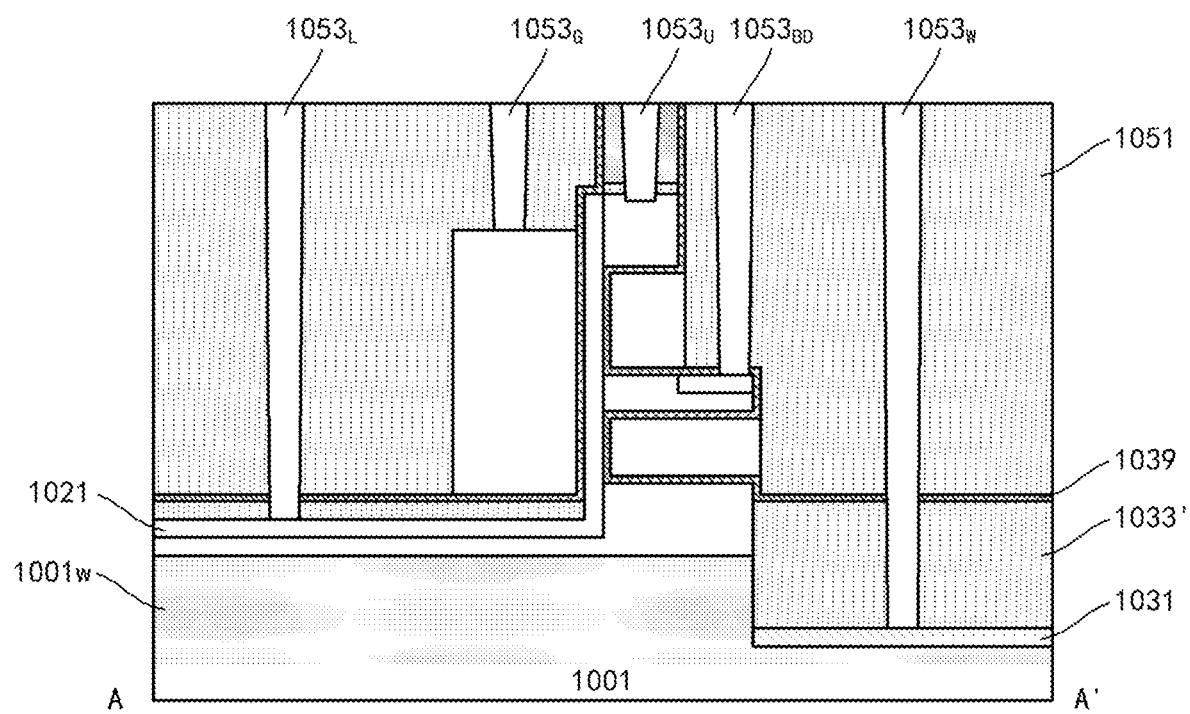
Figure 13C:
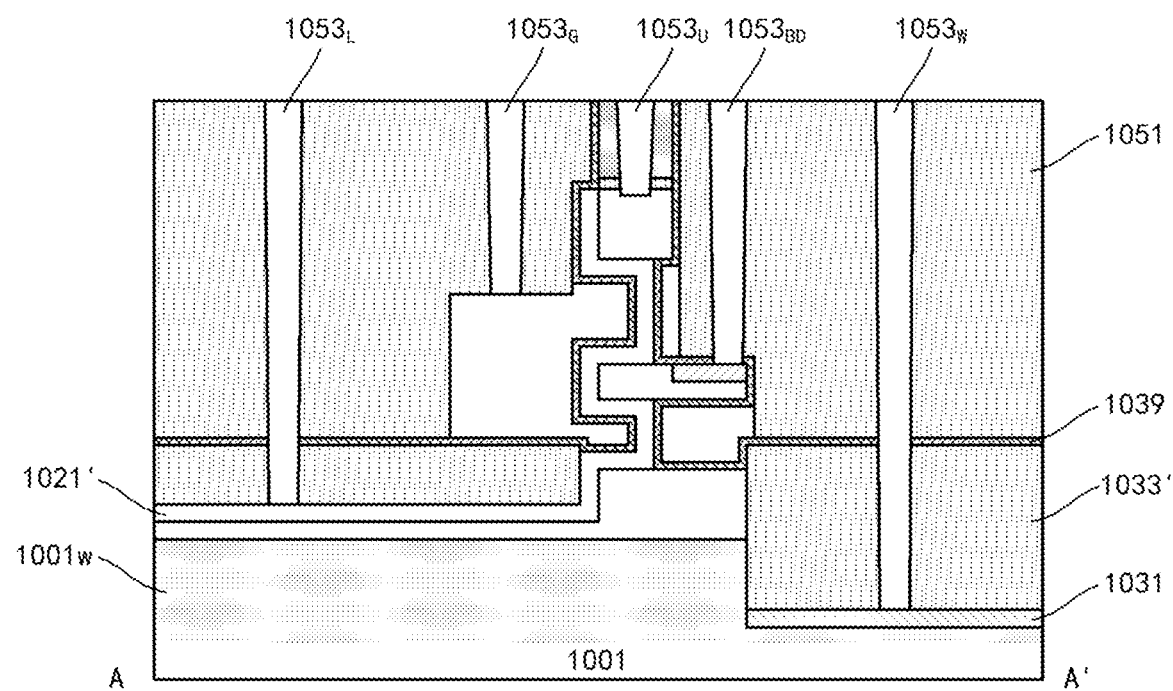

As shown in FIG. 13(*a*) and FIG. 13(*b*), an interlayer dielectric layer 1051 may be formed on the substrate. For example, the interlayer dielectric layer 1051 may be formed by forming, on the substrate 1001, the oxide layer completely covering the structure that has formed on the substrate 1001 by deposition, and performing the planarization process, such as CMP (the CMP may stop at the spacer 1019 of nitride) on the deposited oxide layer.

A contact portion $1053_L$ to the lower source/drain region $S/D_L$, a contact portion $1053_U$ to the upper source/drain region $S/D_U$, a contact portion $1053_{BD}$ to the body contact region BD, a contact portion $1053_G$ to the gate stack (specifically, the gate conductor layer 1041) and a contact portion $1053_w$ to the well region 1001*w* may be formed in the interlayer dielectric layer 1051. The contact portion $1053_L$ is landed on a portion of the first source/drain defining layer 1003 protruding with respect to an upper conductive layer (e.g., the gate conductor layer 1041). The contact portion $1053_U$ is landed on (a portion defined by the spacer 1019 in) the second source/drain defining layer 1011 (the second source/drain defining layer 1011 achieves an electrical contact of the contact portion $1053_U$ to the upper source/drain region $S/D_U$, and thus may be called the upper source/drain region contact layer). The contact portion $1053_{BD}$ is landed on (a portion defined by the spacer 1027 in) the body contact defining layer 1007 (the body contact defining layer 1007 achieves a body contact of the contact portion $1053_{BD}$ to the active region, and thus may be called a body contact layer). Here, due to the GAA configuration, a device may be configured with a single contact portion $1053_G$ to the gate conductor layer 1041. The contact portions may be formed by etching a hole in the interlayer dielectric layer 1051 and filling the hole with a conductive material such as a metal.

As shown in FIG. 13(*a*) and FIG. 13(*b*), the semiconductor device according to such embodiments may include a vertical active region defined by the active layer 1021. The vertical active region may include the lower source/drain region $S/D_L$, the upper source/drain region $S/D_U$ and the channel region therebetween. As described above, a thickness and a length of the channel region may be controlled by an epitaxial growth, and the epitaxial growth may achieve a control accuracy of an even monoatomic layer.

The channel region may have the body contact region BD therein. The body contact region BD may occupy only a part of the channel region in the vertical direction. As described above, the body contact region BD may be located in the substantially middle portion of the channel region in the vertical direction, or may be biased towards the lower source/drain region $S/D_L$ or the upper source/drain region $S/D_U$. A body bias may be applied to the active region through the contact portion $1053_{BD}$ (via the body contact region BD) to reduce a floating-body effect. A position and a size of the body contact region BD in the vertical direction may be controlled by the epitaxial growth, and the epitaxial growth may achieve the control accuracy of the even monoatomic layer.

A remaining portion of the channel region other than the body contact region BD may also be doped (e.g., a diffusion from the first channel defining layer 1005 and/or the second channel defining layer 1009), and a doping characteristic may be different from a doping characteristic in the body contact region BD. For example, a doping concentration in the body contact region BD may be higher than a doping concentration (which is defined by the diffusion from the first channel defining layer 1005) in a region between the body contact region BD and the lower source/drain region $S/D_L$ and/or a doping concentration (which is defined by the diffusion from the second channel defining layer 1009) in a region between the body contact region BD and the upper source/drain region $S/D_U$.

The body contact defining layer 1007 (or the body contact layer) may be provided on a side of the vertical active region (a right side in FIG. 13(*b*)), on which the contact portion $1053_{BD}$ may be landed. The body contact region BD may be self-aligned with the body contact layer.

The gate stack (1039/1041) may surround the vertical active region, especially the channel region therein. The gate stack sandwiches the body contact layer on a side where the body contact layer is located. The gate stack may be self-aligned with the channel region as shown in FIG. 13(*c*).

According to other embodiments of the present disclosure, a separate gate configuration may further be formed. For example, gate stacks may be formed on two opposite sides (e.g., left and right sides) of the active layer, respectively. In a case of forming the separate gate configuration, an isolation between different gate stacks is also required.

Figure 14A:
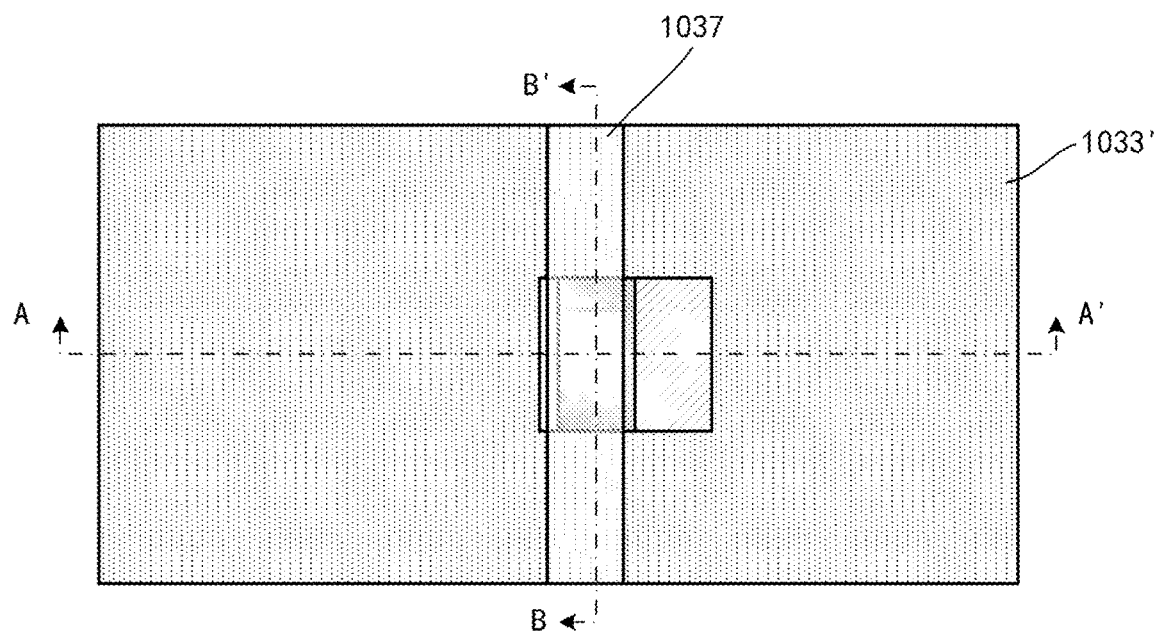
FIG. 14(a) to FIG. 18(c) show schematic diagrams of some stages in a process of manufacturing a semiconductor device according to another embodiment of the present disclosure.
Figure 14B:
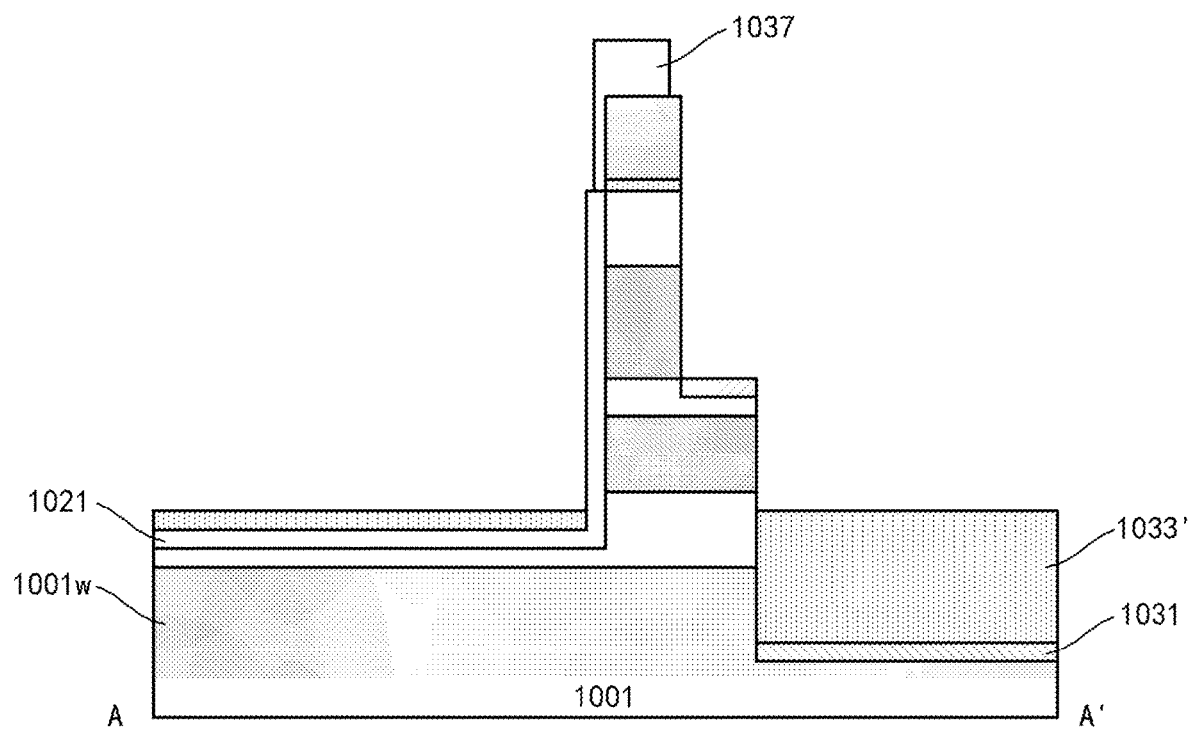
Figure 14C:
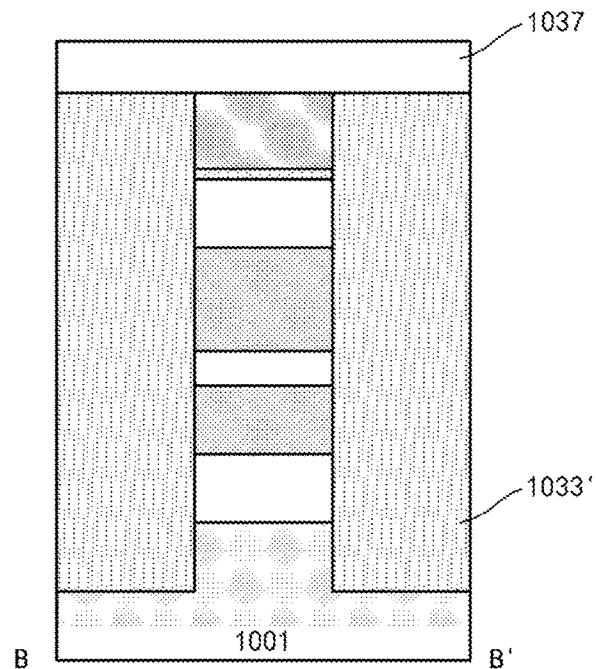
Figure 18A:
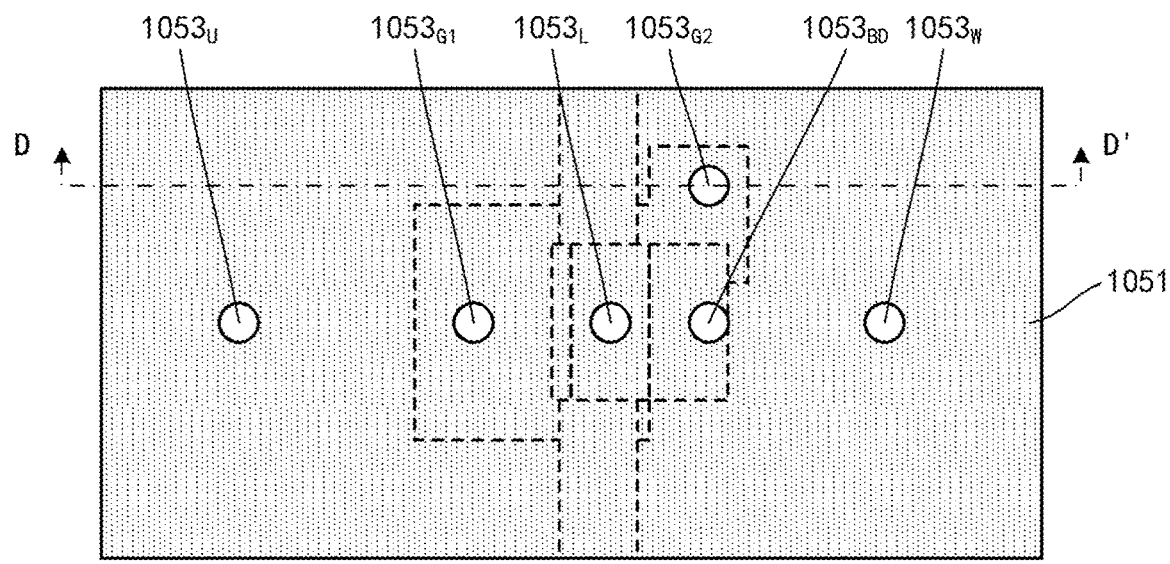
Figure 18B:
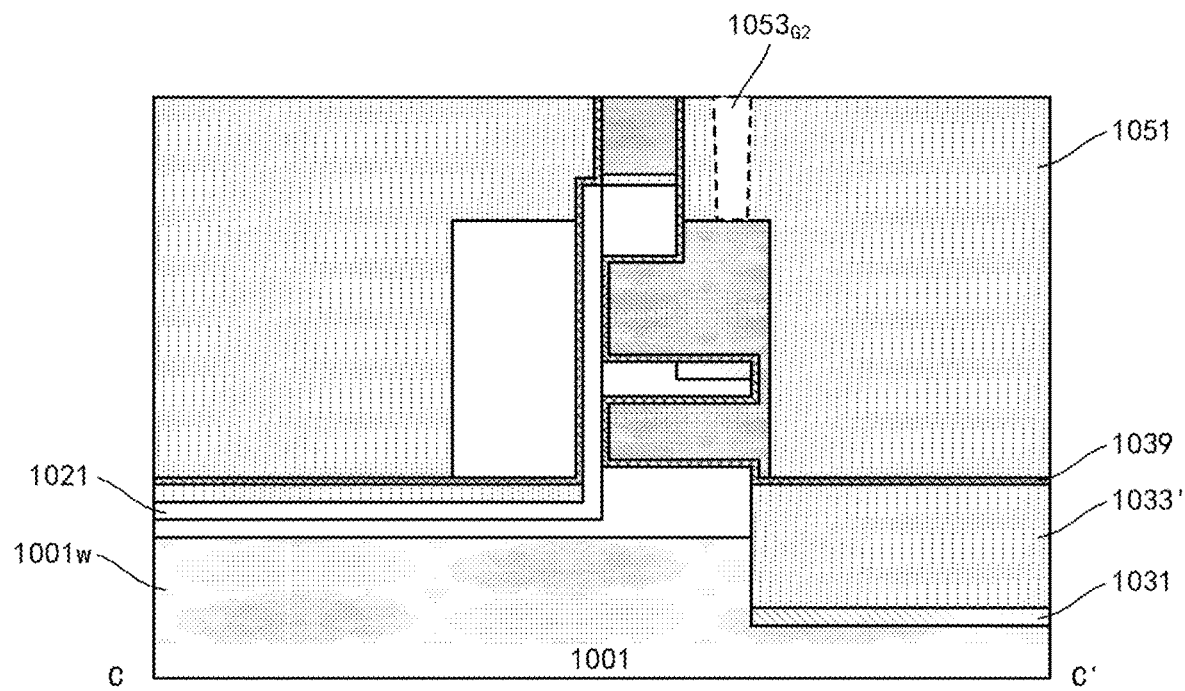
Figure 18C:
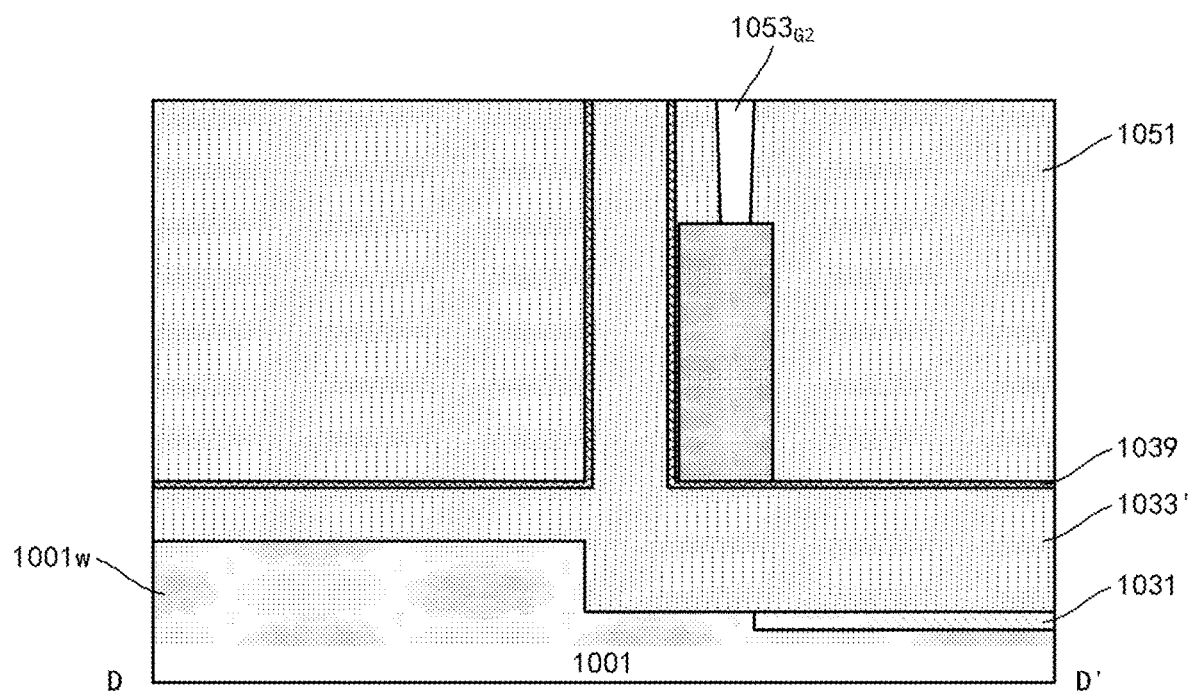

FIG. 14(*a*) to FIG. 18(*c*) show schematic diagrams of some stages in a process of manufacturing a semiconductor device according to another embodiment of the present disclosure.

As shown in FIG. 14(*a*), FIG. 14(*b*) and FIG. 14(*c*), in the process of forming the isolation layer 1033' as described above in connection with FIG. 9(*a*) and FIG. 9(*b*), after planarizing and before etching back the oxide, a photoresist 1037 may be formed on the planarized oxide. The photoresist 1037 may be patterned into such a shape that: on the one hand, a sidewall of the active layer 1021 on the left side may be exposed, so that an oxide left by the photoresist 1037 on the left side may not shield the sidewall of the active layer 1021; on the other hand, a sidewall of the spacer 1019 on the right side may be exposed, so that an oxide left by the photoresist 1037 on the right side may not shield the sidewall of the stack of semiconductor layers, especially sidewalls of the first and second channel defining layers therein. Accordingly, the photoresist 1037 may be patterned into a stripe extending in the first direction between the left sidewall of the active layer 1021 and the right sidewall of the spacer 1019. In the presence of the photoresist 1037, the isolation layer 1033' may be formed by etching back the oxide, and other conditions for etching back may be the same as the condition in the above-mentioned embodiments. After that, the photoresist 1037 may be removed.

The formed isolation layer 1033' not only surrounds each section as described above, but also has a protrusion portion (a portion shielded by the photoresist 1037) which extends from two opposite sides of the active layer 1021 in the first direction (see FIG. 14(*a*) and FIG. 14(*c*), and see FIG. 18(*c*)), so that a space on the isolation layer 1033' may be separated into a first space on a left side of the protrusion portion and a second space on a right side of the protrusion portion.

After that, the gate stack may be formed as described above in connection with FIG. 11(*a*) and FIG. 11(*b*). Due to an existence of the protrusion portion of the isolation layer 1033', the formed gate stack may include two portions: a portion (which may be called "a first gate stack") on the left side of the protrusion portion of the isolation layer 1033' and a portion (which may be called "a second gate stack") on the right side of the protrusion portion of the isolation layer 1033', and the two portions may be electrically isolated from each other by the protrusion portion of the isolation layer 1033'. The first gate stack and the second gate stack may be used for different purposes, respectively, for example, one of which, such as the first gate stack, may be used as a control gate, while the other, such as the second gate stack, may be used to control Vt.

In this example, the first gate stack and the second gate stack include the same gate dielectric layer 1039 and gate conductor layer 1041. However, the present disclosure is not limited thereto. The first gate stack and the second gate stack may have different configurations, such as different work function layers.

Figure 15:
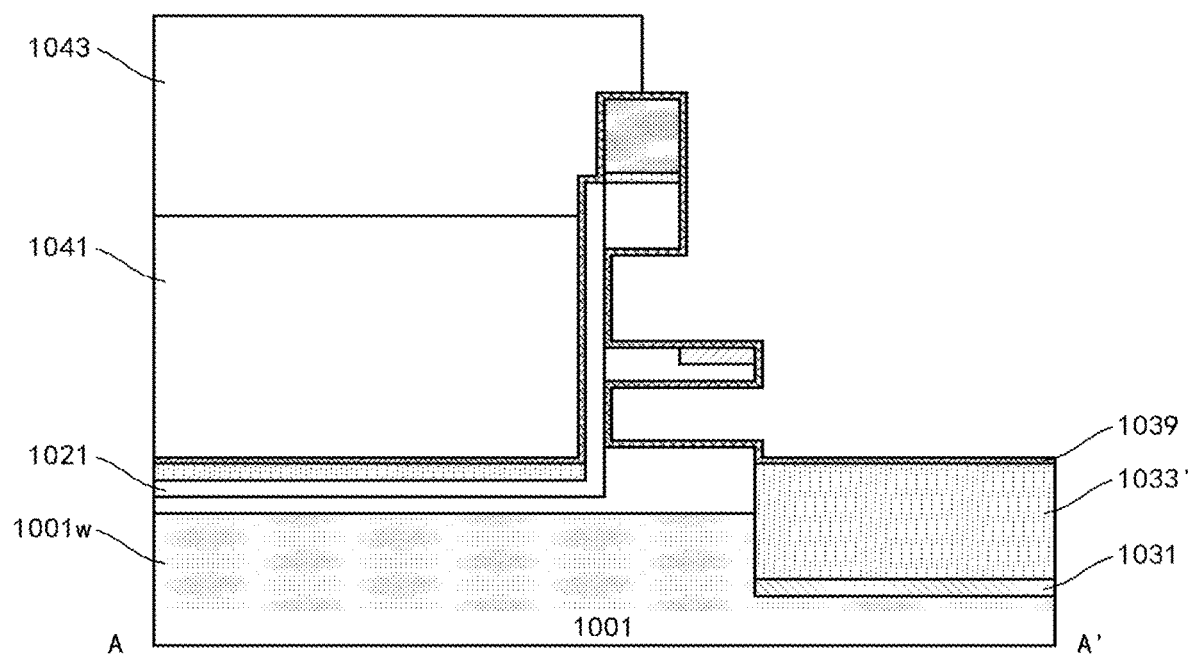
Figure 16:
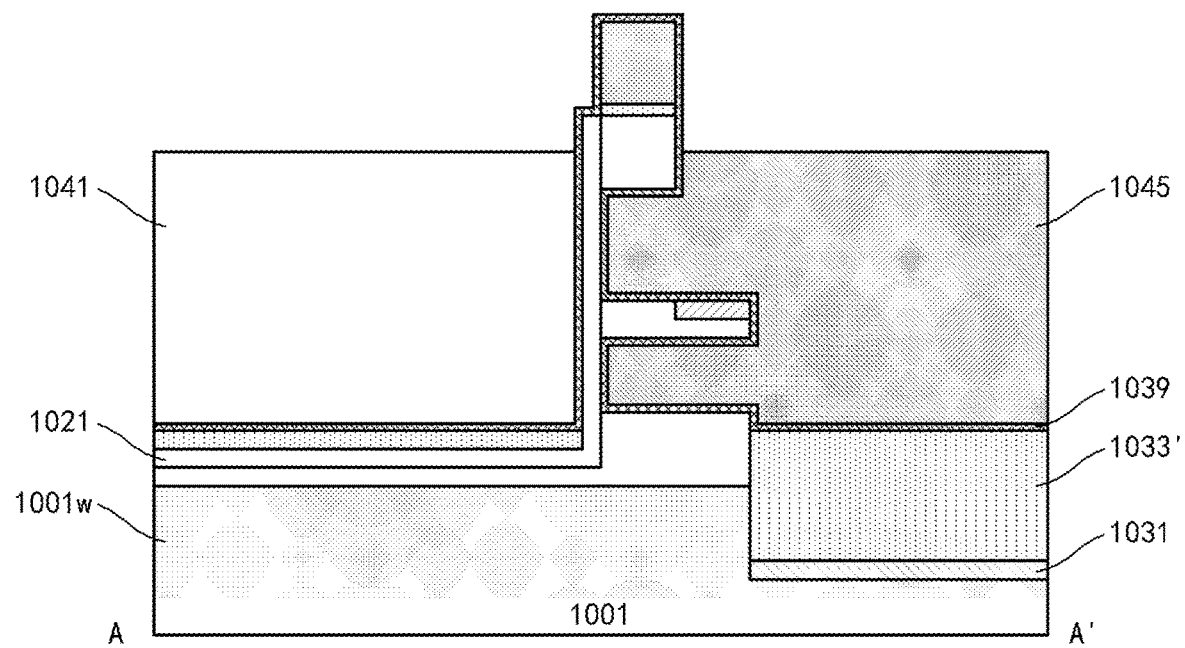

For example, as shown in FIG. 15, the first gate stack on the left side may be shielded by using, for example, a photoresist 1043, while the second gate stack on the right side may be exposed. The gate conductor layer 1041 in the second gate stack may be removed by the selective etching (for convenience, the gate conductor layer 1041 is referred to as "a first gate conductor layer"). After that, the photoresist 1043 may be removed. Then, as shown in FIG. 16, a second gate conductor layer 1045 may be additionally formed on the gate dielectric layer 1039 by, for example, deposition and etching back. A top surface of the second gate conductor layer 1045 may be substantially flush with a top surface of the first gate conductor layer 1041. The second gate conductor layer 1045 may also include a work function layer (and optionally, a conductive material layer), but have a different characteristic from the first gate conductor layer 1041, such as a different effective work function. Accordingly, the first gate stack and the second gate stack with different configurations may be formed on the left and right sides, respectively.

In this example, when a different second gate stack is formed, the gate dielectric layer 1039 is retained. However, the present disclosure is not limited thereto. For example, the gate dielectric layer 1039 may be removed, a further gate dielectric layer may also be additionally formed, and the second gate conductor layer 1045 may be formed on the further gate dielectric layer.

Contact portions to the first gate stack and the second gate stack may be formed, respectively.

Figure 17A:
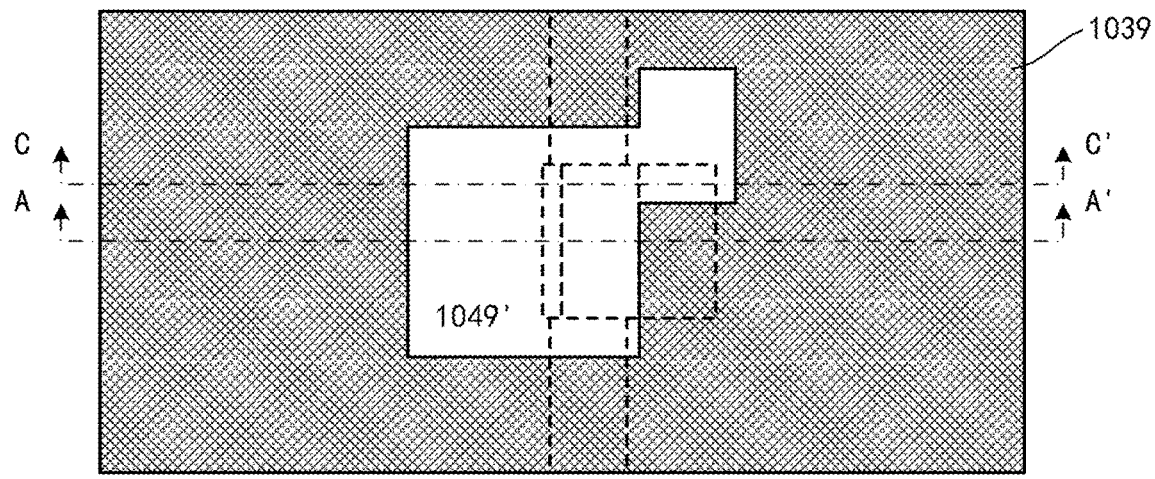
Figure 17B:
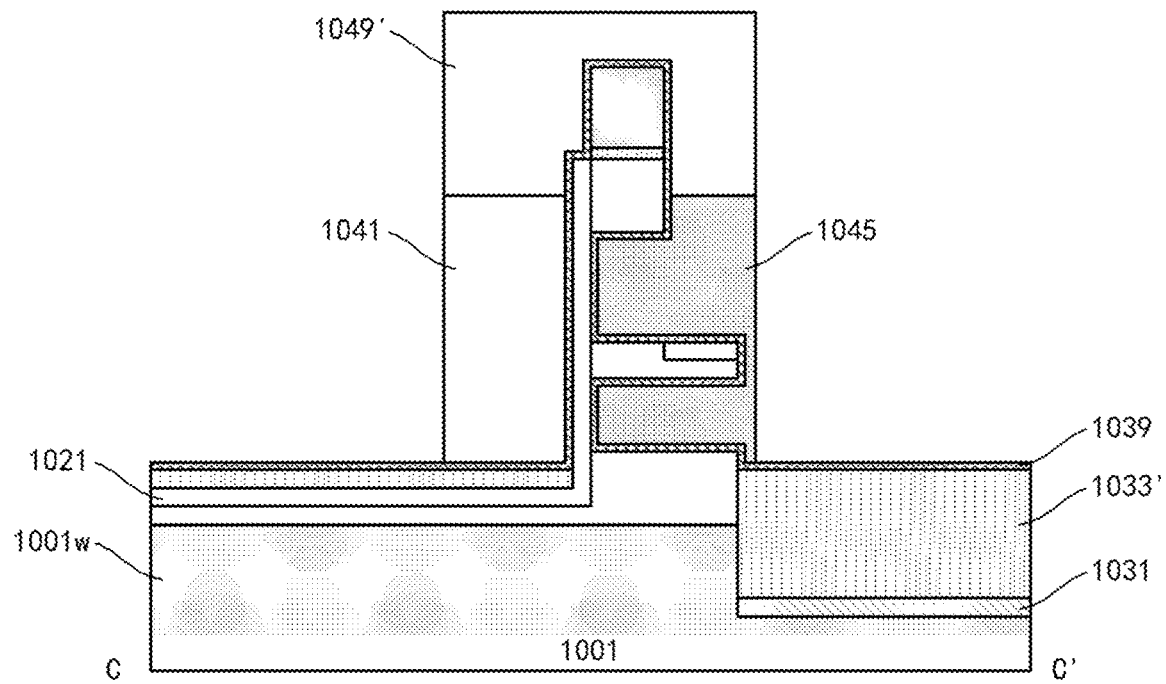

As shown in FIG. 17(*a*) and FIG. 17(*b*), a photoresist 1049' may be formed on the first gate conductor layer 1041 and the second gate conductor layer 1045, and patterned into a shape substantially the same as a shape of the photoresist 1049 as described above in connection with FIG. 12(*a*) and FIG. 12(*b*), except that a part of the region (as schematically shown in a region at an upper right corner of the photoresist 1049' in a top view of FIG. 17(*a*)) is additionally covered on the right side of the active region 1021, so as to define a landing pad of a contact portion to the second gate stack. Here, the part of region does not overlap at least a part of a region of the body contact layer 1007 used to define the landing pad of the contact portion to the body contact region BD, so as not to interfere with the subsequently formed contact region to the body contact region BD. The first gate conductor layer 1041 and the second gate conductor layer 1045 may be etched by the selective etching, such as the RIE in the vertical direction, by using the photoresist 1049' thus patterned and the spacer 1019 as etching masks. After that, the photoresist 1049' may be removed.

FIG. 17(*b*) schematically shows a cross-sectional view taken along line CC' in FIG. 17(*a*). A cross-sectional view taken along line AA' in FIG. 17(*a*) is substantially the same as a cross-sectional view shown in FIG. 12(*b*), except that the integrated gate stack is replaced with the first gate stack and the second gate stack that are isolated from each other.

As shown in FIG. 18(*a*), FIG. 18(*b*) and FIG. 18(*c*), the interlayer dielectric layer 1051 may be formed as described above in connection with FIG. 13(*a*) and FIG. 13(*b*), and various contact portions may be formed in the interlayer dielectric layer 1051. Different from the above-mentioned embodiments, a contact portion $1053_{G1}$ to the first gate stack and a contact portion $1053_{G2}$ to the second gate stack are formed, respectively. The contact portion $1053_{G2}$ to the second gate stack may be landed on a landing pad defined by the above-mentioned additional portion of the photoresist 1049'.

In the cross-sectional view of FIG. 18(*b*), the contact portion $1053_{G2}$ to the second gate stack is schematically shown by a dotted line. This is because the contact portion $1053_{G2}$ is not in a cross-section taken along line CC', but in a cross-section taken along line DD' as shown in FIG. 18(*c*). In the subsequent drawings, the cross-section (e.g., the cross-section taken along line DD' as shown in FIG. 18(*c*)) unrelated to the active region will not particularly shown. If a contact portion exists in the cross-section, a corresponding contact portion may be marked on a relevant layer in a form of a dotted line as shown in FIG. 18(*b*).

In the above-mentioned embodiments, the second gate stack overlaps a lower portion (a region corresponding to the first channel defining layer 1005) and an upper portion (a region corresponding to the second channel defining layer 1009) of the channel region in the active layer 1021 on the right side of the protrusion portion of the isolation layer 1033', respectively, with the body contact defining layer 1007 sandwiched therebetween. The overlapped portions between the gate stack and the lower portion and the upper portion of the channel region have a same configuration. However, the present disclosure is not limited thereto. They may have different configurations, for example, different work function layers, and may be used, for example, to optimize a bottom portion GIDL and a top portion GIDL.

FIG. 19 to FIG. 23(*c*) show schematic diagrams of some stages in a process of manufacturing a semiconductor device according to another embodiment of the present disclosure.

Figure 19:
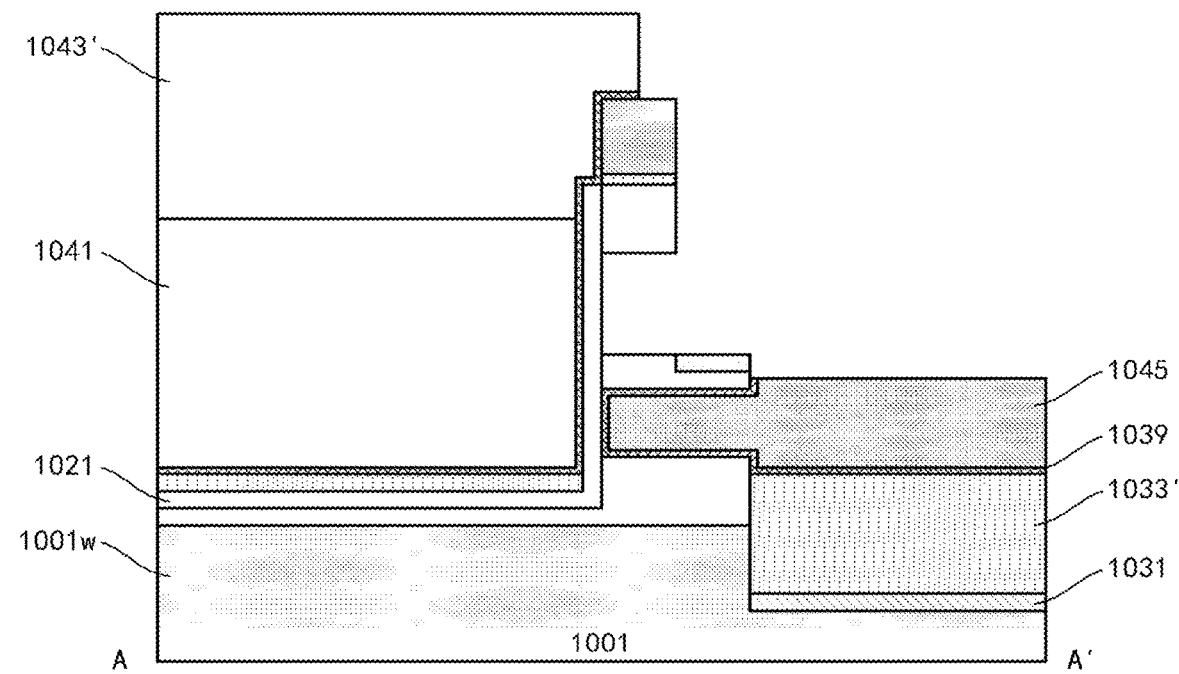
FIG. 19 to FIG. 23(c) show schematic diagrams of some stages in a process of manufacturing a semiconductor device according to another embodiment of the present disclosure.

For example, as shown in FIG. 19, after the second gate stack is formed as described above in connection with FIG. 15 and FIG. 16, the first gate stack on the left side may be shielded by using, for example, a photoresist 1043', while the second gate stack on the right side may be exposed (here, a case that the second gate stack includes the second gate conductor layer 1045 as described above in connection with FIG. 15 and FIG. 16 is taken as an example for description; however, the following descriptions may also apply to a case that the second gate stack includes the first gate conductor layer 1041). The second gate conductor layer 1045 in the second gate stack may be etched back by the selective etching, and a top surface of the etched second gate conductor layer 1045 may expose the upper portion of the channel region and shield the lower portion of the channel region after the etching back. For example, a height of the top surface of the etched second gate conductor layer 1045 is between a height of a top surface of the body contact defining layer 1007 and a height of a bottom surface of the body contact defining layer 1007. The gate dielectric layer 1039 exposed by the etching back of the second gate conductor layer 1045 may be removed by the selective etching. Accordingly, the second gate stack (1039/1045) may overlap the lower portion of the channel region to control the lower portion of the channel region and may not overlap the upper portion of the channel region. After that, the photoresist 1043' may be removed.

Figure 20:
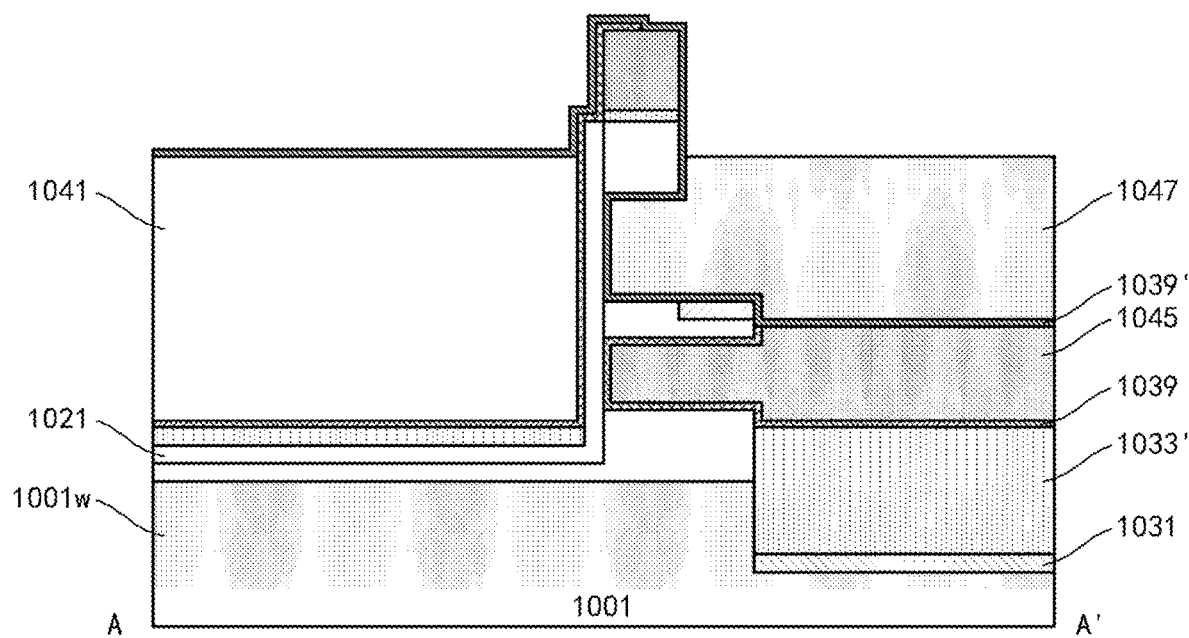

For the upper portion of the channel region, an additional gate stack may be formed. For example, as shown in FIG. 20, an additional gate dielectric layer 1039' and an additional gate conductor layer 1047 (for convenience, the gate conductor layer 1047 is referred to as "a third gate conductor layer") may be formed in sequence on the second gate conductor layer 1045. The gate dielectric layer 1039' may be formed in a substantially conformal manner and may extend to the first gate stack. The gate dielectric layer 1039' may include the same material as the gate dielectric layer 1039 or a different material from the gate dielectric layer 1039. The third gate conductor layer 1047 may be etched back until a top surface of the third gate conductor layer 1047 may be substantially flush with the top surface of the first gate conductor layer 1041. The third gate conductor layer 1047 may include the work function layer (and optionally, the conductive material layer), but has a different characteristic from the second gate conductor layer 1045 (and from the first gate conductor layer 1041), such as a different effective work function. Accordingly, the second gate stack may be formed into two portions with different configurations.

Different gate configurations may be formed as required: a GAA gate configuration, a separate gate configuration on two opposite sides of the active region, and a configuration where the gate stack on a side (specifically, a side where the body contact layer is located) of the active region have different portions. The separate gate stacks or different portions of the gate stack may have different effective work functions. Device performances, such as a Vt control, a GIDL optimization, etc. as described above, may be optimized by using the different gate configurations.

Contact portions to the first gate conductor layer, the second gate conductor layer and the third gate conductor layer may be formed, respectively.

Figure 21A:
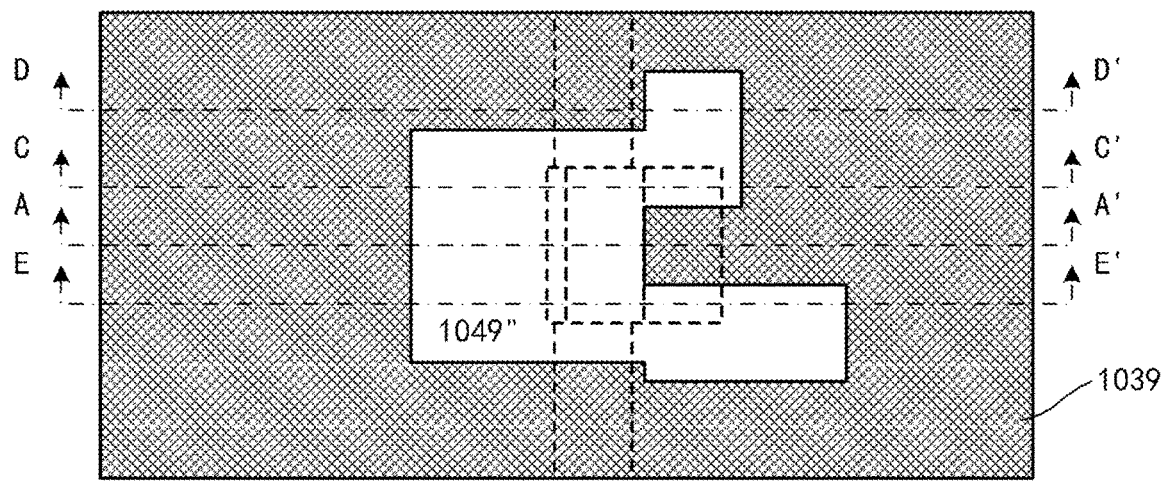
Figure 21B:
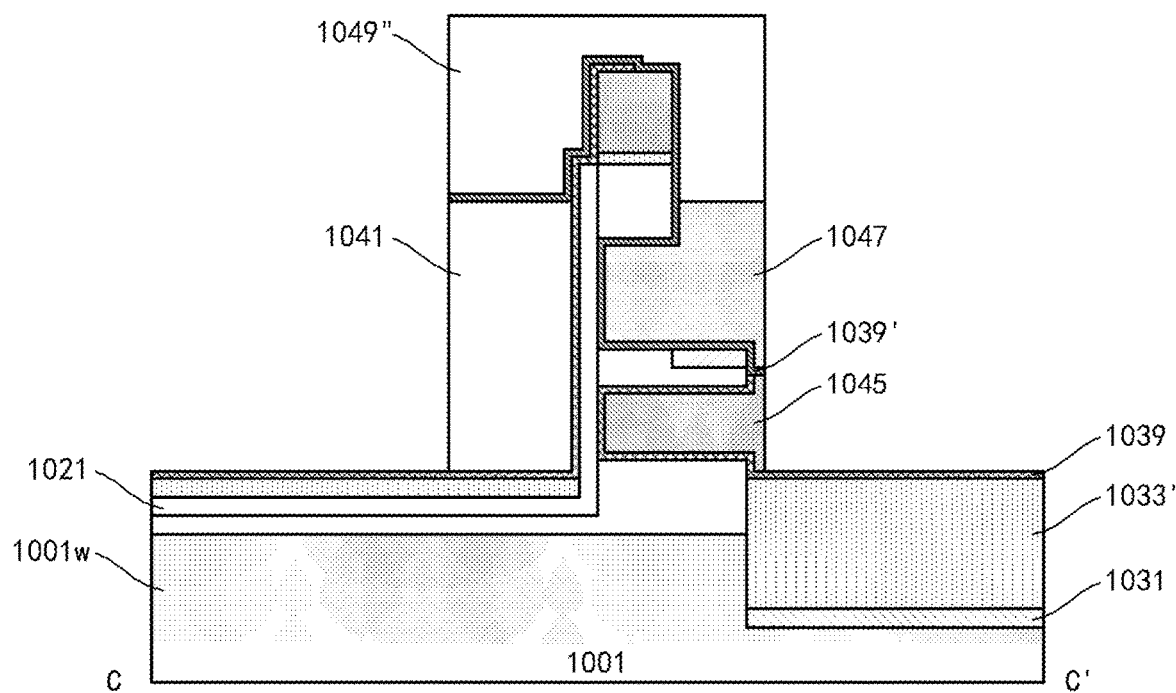
Figure 21C:
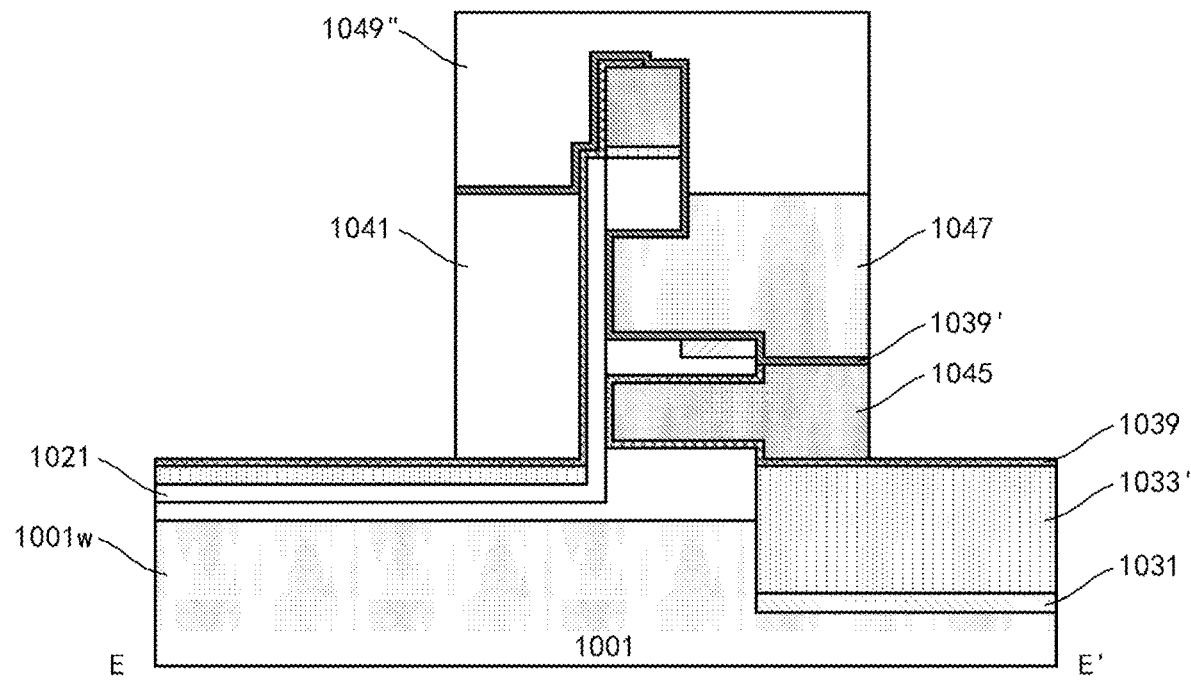

As shown in FIG. 21(*a*), FIG. 21(*b*) and FIG. 21(*c*), a photoresist 1049" may be formed on the first gate conductor layer 1041, the second gate conductor layer 1045 and the third gate conductor layer 1047, and patterned into a shape substantially the same as a shape of the photoresist 1049' as described above in connection with FIG. 17(*a*) and FIG. 17(*b*), except that some more regions (as schematically shown in a region at a lower right corner of the photoresist 1049" in a top view of FIG. 21(*a*)) are covered on the right side of the active region 1021, so as to define a landing pad of a contact portion to the third gate conductor layer 1047 (a landing pad of a contact portion to the second gate conductor layer 1045 may be defined by a region at an upper right corner of the photoresist 1049" as described above in connection with FIG. 17(*a*) and FIG. 17(*b*)). Here, the regions do not overlap at least a part of the region of the body contact layer 1007 used to define the landing pad of the contact portion to the body contact region BD, so as not to interfere with the subsequently formed contact portion to the body contact region BD. The first gate conductor layer 1041, (the gate dielectric layer 1039'), the second gate conductor layer 1045 and the third gate conductor layer 1047 may be etched by the selective etching, such as the RIE in the vertical direction, by using the photoresist 1049" thus patterned and the spacer 1019 as etching masks. After that, the photoresist 1049" may be removed.

FIG. 21(*b*) schematically shows a cross-sectional view taken along line CC' in FIG. 21(*a*), and FIG. 21(*c*) schematically shows a cross-sectional view taken along line EE' in FIG. 21(*a*). A cross-sectional view taken along line AA' in FIG. 21(*a*) is substantially the same as the cross-sectional view shown in FIG. 12(*b*), except that the integrated gate stack is replaced with the first gate stack and the second gate stack that are isolated from each other and the second gate stack includes two portions with different configurations.

Figure 22:
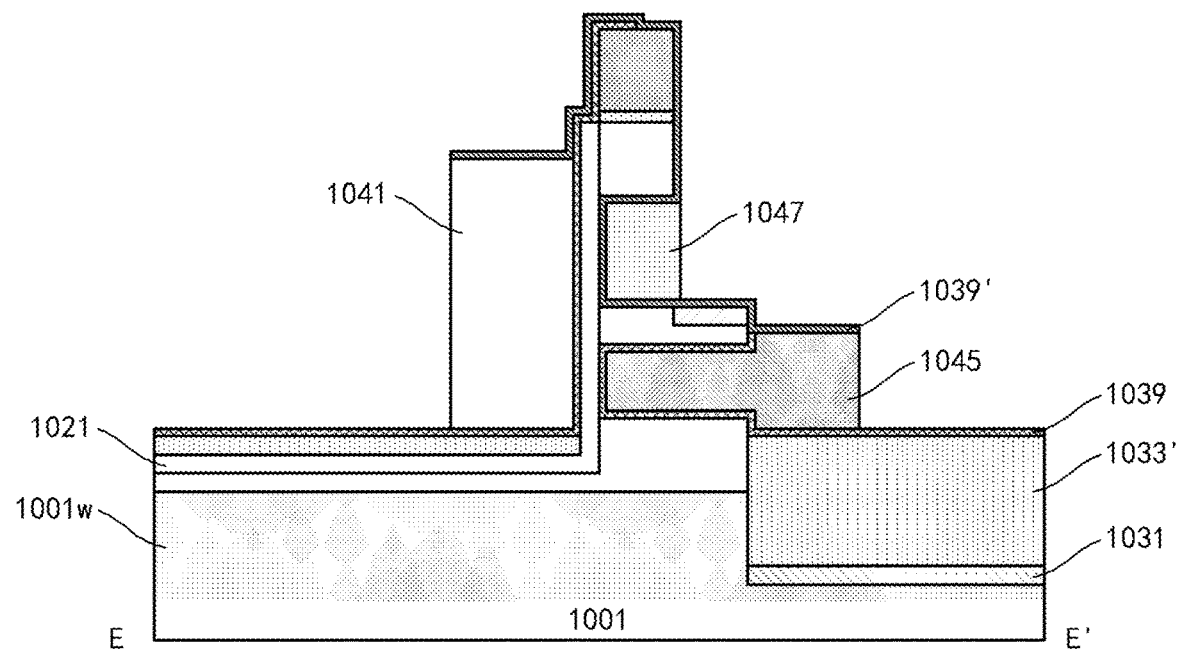

As shown in FIG. 22, for example, a landing pad region (as shown in a region at an upper right corner of the photoresist 1049" in the top view of FIG. 21(*a*)) of the contact portion to the second gate conductor layer 1045 may be covered by using a photoresist, while a landing pad region (as shown in the region at the lower right corner of the photoresist 1049" in the top view of FIG. 21(*a*)) of the contact portion to the third gate conductor layer 1047 may be exposed. The second gate conductor layer 1045 may be further etched by the selective etching, such as the RIE in the vertical direction (which may stop at the gate dielectric layer 1039'), so as to remove the second gate conductor layer 1045 from above the third gate conductor layer 1047.

Figure 23A:
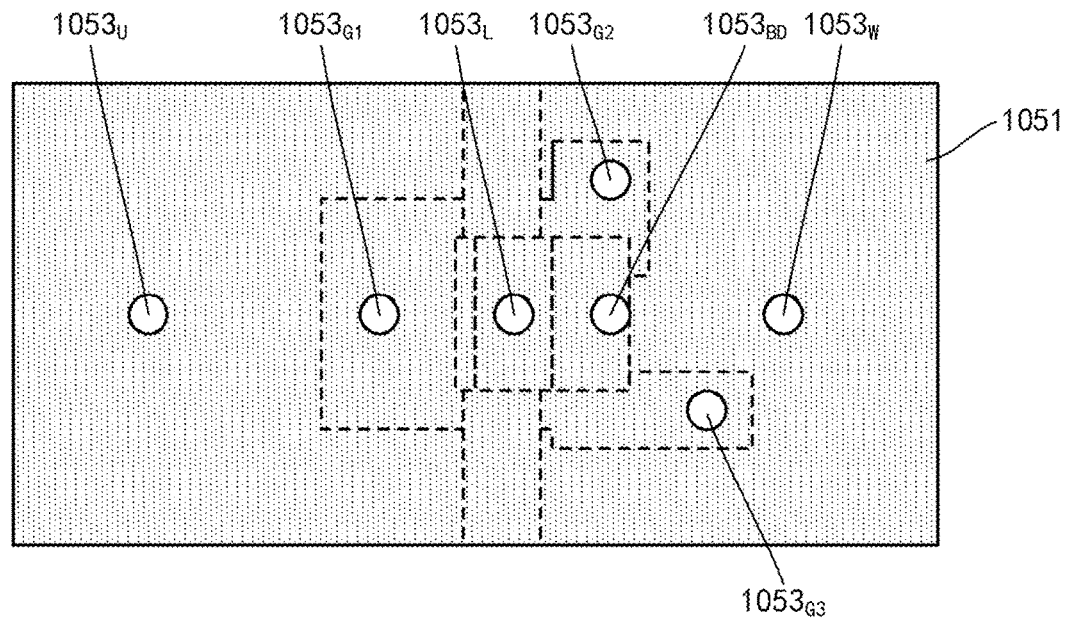
Figure 23B:
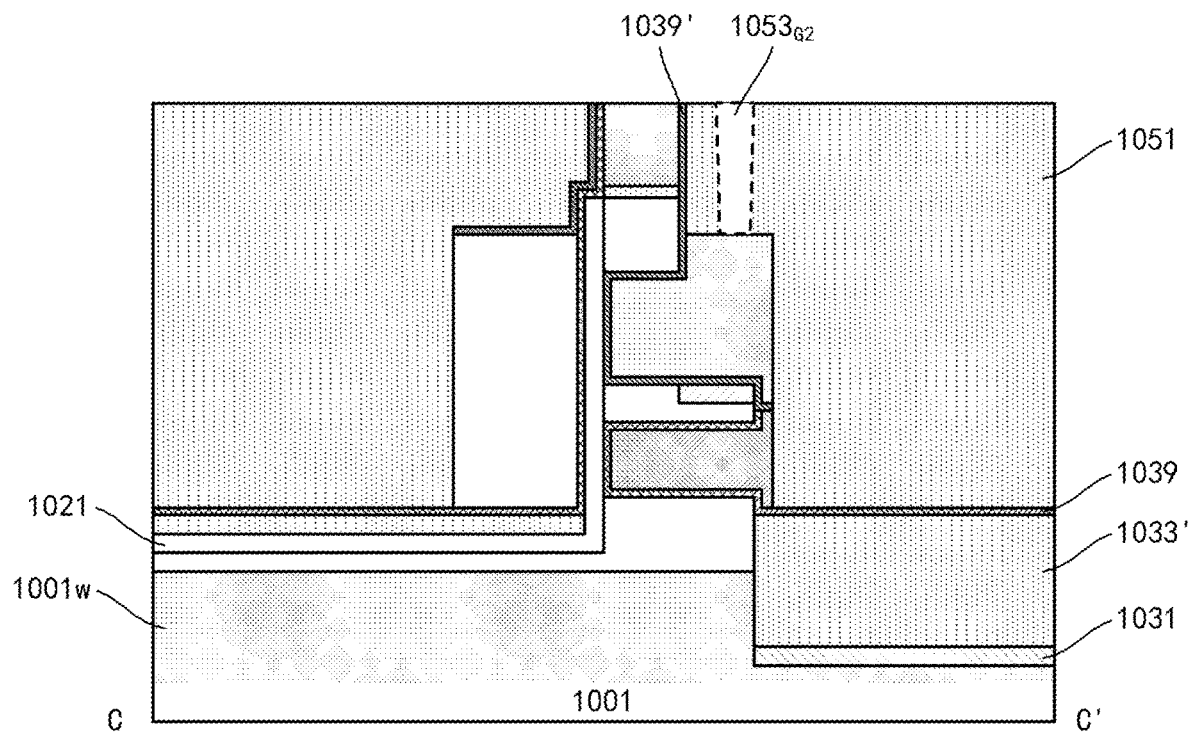
Figure 23C:
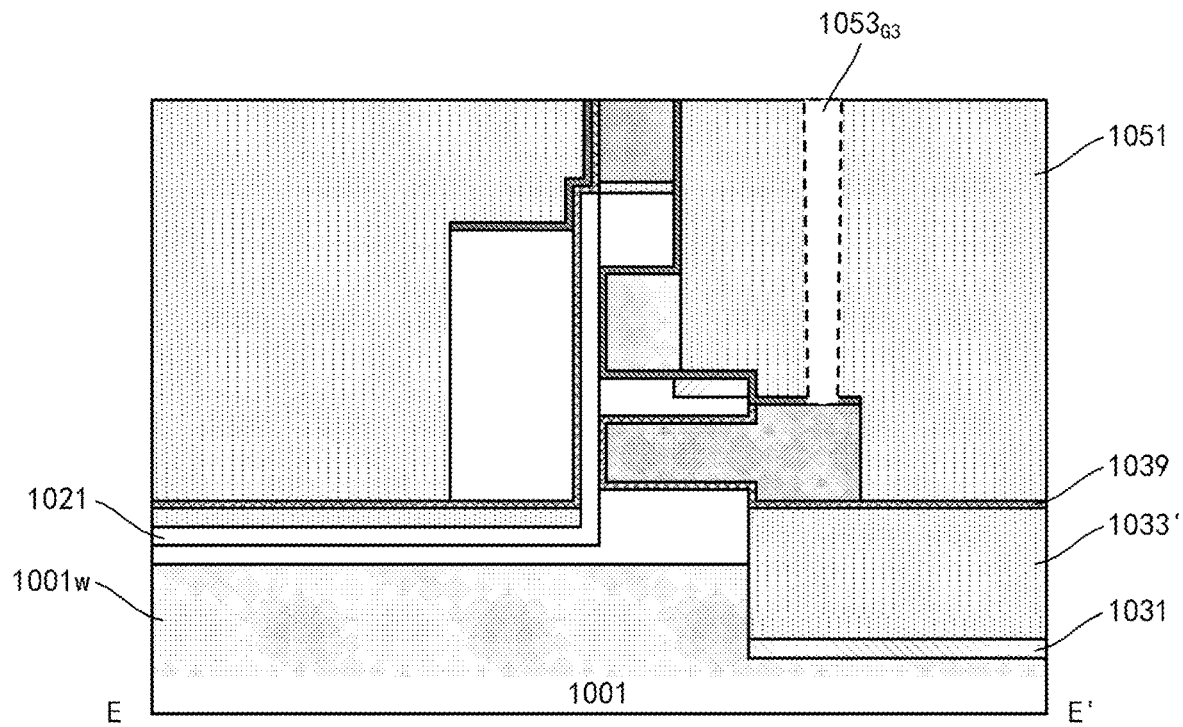

As shown in FIG. 23(*a*), FIG. 23(*b*) and FIG. 23(*c*), the interlayer dielectric layer 1051 may be formed as described above in connection with FIG. 13(*a*) and FIG. 13(*b*), and various contact portions may be formed in the interlayer dielectric layer 1051. Different from the above-mentioned embodiments, the contact portion $1053_{G1}$ to the first gate conductor layer 1041, the contact portion $1053_{G2}$ to the second gate conductor layer 1045 and the contact portion $1053_{G3}$ to the third gate conductor layer 1047 are formed, respectively. The contact portion $1053_{G2}$ to the second gate conductor layer 1045 and the contact portion $1053_{G3}$ to the third gate conductor layer 1047 may be landed on a landing pad defined by the above-mentioned additional portion of the photoresist 1049".

In the above-mentioned embodiments, the contact portion to the body contact layer and the contact portion to the gate conductor layer may be formed, respectively. According to other embodiments of the present disclosure, the body contact layer and the gate conductor layer may have a common contact portion.

Figure 24A:
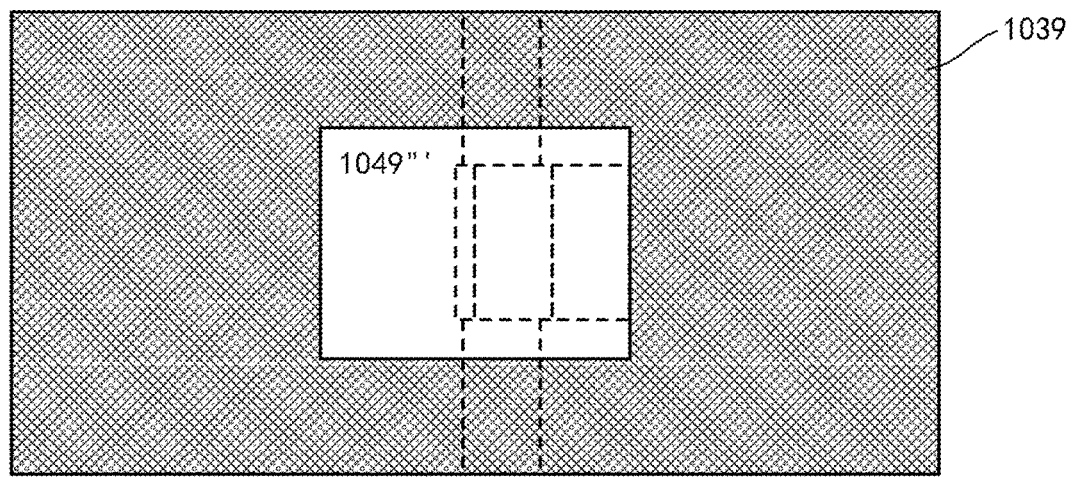
FIG. 24(a) to FIG. 25(b) show schematic diagrams of some stages in a process of manufacturing a semiconductor device according to another embodiment of the present disclosure.
Figure 24B:
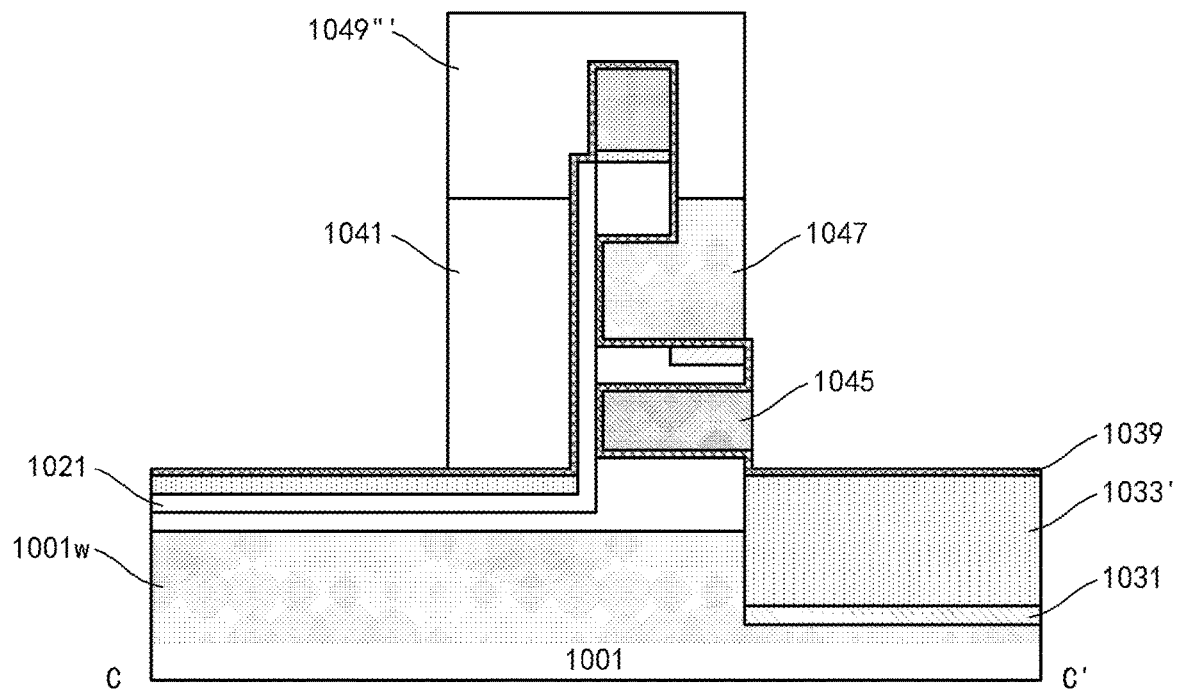
Figure 25A:
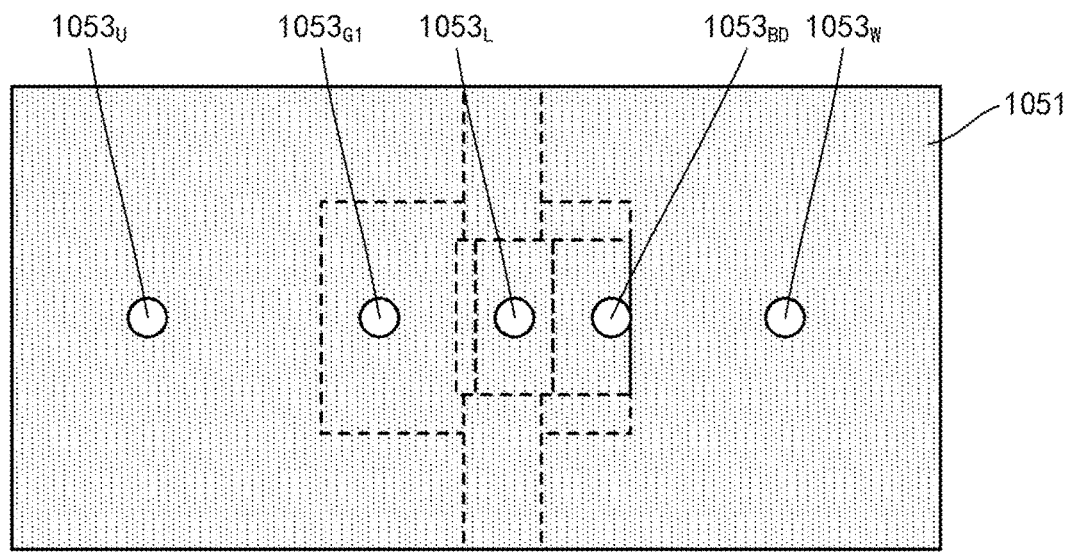
Figure 25B:
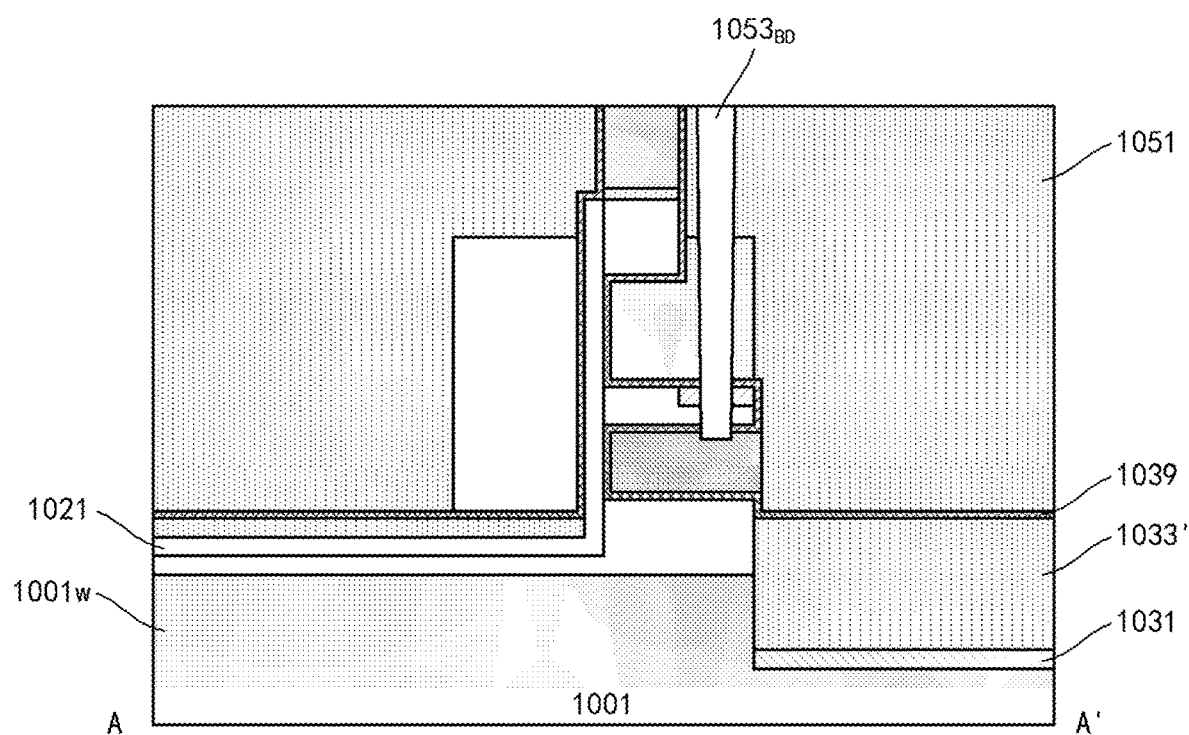

FIG. 24(*a*) to FIG. 25(*b*) show schematic diagrams of some stages in a process of manufacturing a semiconductor device according to another embodiment of the present disclosure.

As shown in FIG. 24(*a*) and FIG. 24(*b*), a photoresist 1049''' may be formed on the gate conductor layer, and patterned into a shape substantially the same as the shape of the photoresist 1049 as described above in connection with FIG. 12(*a*) and FIG. 12(*b*), except that the photoresist 1049''' may overlap at least a part of the landing pad of the contact portion to the body contact region BD previously defined by the spacer 1027 in the body contact defining layer 1007 in the plan view. The gate conductor layer may be etched by the selective etching, such as the RIE in the vertical direction, by using the photoresist 1049''' thus patterned (and possibly, the spacer 1019, if there is still a portion not covered by the photoresist 1049''') as an etching mask. After that, the photoresist 1049''' may be removed.

After that, as shown in FIG. 25(*a*) and FIG. 25(*b*), the interlayer dielectric layer 1051 may be formed as described above in connection with FIG. 13(*a*) and FIG. 13(*b*), and various contact portions may be formed in the interlayer dielectric layer 1051. Different from the above-mentioned embodiments, the contact portion 1053$_{BD}$ may penetrate through the third gate conductor layer 1047 and the body contact layer 1007 and extend into the second gate conductor layer 1045. Here, it is not required to additionally form the gate dielectric layer 1039' as described above in connection with FIG. 20, while the gate dielectric layer 1039 may be retained, and the third gate conductor layer 1047 may be directly formed after etching back the second gate conductor layer 1045, because the second gate conductor layer 1045 and the third gate conductor layer 1047 are electrically connected to each other in this example, and do not need to be electrically isolated from each other by using, for example, the gate dielectric layer 1039'.

Although a case that the second gate stack has the second gate conductor layer 1045 and the third gate conductor layer 1047 is illustrated in this example, the common contact portion 1053$_{BD}$ may be applied to the second gate stack of other configurations in a case that the gate stack is separated, for example, a case that the second gate stack includes an integrated structure (e.g., includes only the first gate conductor layer 1041 or only the second gate conductor layer 1045).

In addition, although the common contact portion 1053$_{BD}$ may be in contact with all of the third gate conductor layer 1047, the body contact layer 1007 and the second gate conductor layer 1045 in this example, the present disclosure is not limited to this. For example, the common contact portion 1053$_{BD}$ may penetrate through the third gate conductor layer 1047 and extend into the body contact layer 1007, without extending to be in contact with the second gate conductor layer 1045. For the second gate conductor layer 1045, an additional contact portion may be formed as described above.

The semiconductor device according to the embodiments of the present disclosure may be applied to various electronic apparatuses. For example, an integrated circuit (IC) may be formed based on the semiconductor device, and thus an electronic apparatus may be constructed. Accordingly, the present disclosure further provides an electronic apparatus including the above-mentioned semiconductor device. The electronic apparatus may further include a display screen cooperating with the integrated circuit, a wireless transceiver cooperating with the integrated circuit, and other components. The electronic apparatus may include, for example, a smart phone, a personal computer, a tablet computer (PC), an artificial intelligence device, a wearable device, a mobile power supply, an automotive electronic apparatus, a communication device or an Internet of Things (IoT) device, etc.

According to embodiments of the present disclosure, there is further provided a method of manufacturing a System on Chip (SoC). The method may include the above-mentioned method. In particular, a variety of devices may be integrated on a chip, at least some of which are manufactured according to the method of the present disclosure.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not exactly the same as the method described above. In addition, although various embodiments have been described above respectively, this does not mean that the measures in various embodiments may not be advantageously used in combination.

Embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:
   an active region vertically disposed on a substrate with respect to the substrate, wherein the active region comprises a lower source/drain region, an upper source/drain region, and a middle portion which is located between the lower source/drain region and the upper source/drain region and configured to define a channel region;
   a first gate stack and a second gate stack, wherein the first gate stack and the second gate stack are disposed on a first side of the active region and a second side of the active region which is opposite to the first side of the active region in a lateral direction with respect to the substrate; and
   a body contact layer disposed on the second side of the active region to overlap a part of the middle portion of the active region, so as to apply a body bias to the active region,
   wherein the second gate stack comprises a first portion below the body contact layer and a second portion above the body contact layer.

2. The semiconductor device according to claim 1, wherein the first gate stack and the second gate stack are integrated with each other and continuously extend around a periphery of the active region.

3. The semiconductor device according to claim 1, wherein the first gate stack and the second gate stack are electrically isolated from each other.

4. The semiconductor device according to claim 3, wherein the first gate stack and the second gate stack have effective work functions different from each other.

5. The semiconductor device according to claim 3, wherein the first portion of the second gate stack and the second portion of the second gate stack are adjacent to each other.

6. The semiconductor device according to claim 5, further comprising:
   a first gate contact portion to the first gate stack; and
   a second gate contact portion to the second gate stack.

7. The semiconductor device according to claim 3, wherein the first portion of the second gate stack overlaps a portion below the body contact layer in the middle portion of the active region, the second portion of the second gate stack overlaps a portion above the body contact layer in the middle portion of the active region, and the first portion of the second gate stack and the second portion of the second gate stack are electrically isolated from each other.

8. The semiconductor device according to claim 7, further comprising:
   a first gate contact portion to the first gate stack;
   a second gate contact portion to the first portion of the second gate stack; and
   a third gate contact portion to the second portion of the second gate stack.

9. The semiconductor device according to claim 3, wherein the first portion of the second gate stack and the second portion of the second gate stack have effective work functions different from each other.

10. The semiconductor device according to claim 1, wherein the middle portion of the active region comprises a doping region as a body contact region, and the body contact layer is in contact with the body contact region.

11. The semiconductor device according to claim 10, wherein a conductivity type of the body contact region is opposite to a conductivity type of at least one of the lower source/drain region and the upper source/drain region.

12. The semiconductor device according to claim 10, wherein the body contact region is self-aligned with the body contact layer.

13. The semiconductor device according to claim 10, wherein the body contact layer comprises a dopant of a same conductivity type as a dopant in the body contact region.

14. The semiconductor device according to claim 10, wherein the body contact region occupies only a part of the middle portion of the active region in a vertical direction, and the body contact region and a remaining portion of the middle portion of the active region have different doping characteristics.

15. The semiconductor device according to claim 14, wherein a doping concentration in the body contact region is higher than a doping concentration in at least one of a region between the body contact region and the lower source/drain region and a region between the body contact region and the upper source/drain region in the middle portion of the active region.

16. The semiconductor device according to claim 1, wherein the active region comprises a single crystal semiconductor.

17. The semiconductor device according to claim 1, wherein the body contact layer comprises a single crystal semiconductor.

18. The semiconductor device according to claim 1, further comprising:
a body contact portion to the body contact layer, wherein the body contact portion is configured to receive the body bias,
wherein the body contact layer extends far away from the active region in the lateral direction, and the body contact portion is in contact with the body contact layer.

19. The semiconductor device according to claim 18, wherein the first gate stack and the second gate stack are electrically isolated from each other, and the body contact portion at least passes through and is in contact with the second portion in the first portion and second portion of the second gate stack.

20. The semiconductor device according to claim 18, further comprising:
an upper source/drain region contact layer disposed on the second side of the active region, so as to be in contact with the upper source/drain region; and
an upper source/drain region contact portion landed on the upper source/drain region contact layer.

21. The semiconductor device according to claim 20, wherein the upper source/drain region contact layer comprises a single crystal semiconductor.

22. The semiconductor device according to claim 20, wherein the upper source/drain region contact layer comprises a dopant of a same conductivity type as the upper source/drain region, and the upper source/drain region is self-aligned with the upper source/drain region contact layer.

23. The semiconductor device according to claim 20, wherein a spacing between the upper source/drain region contact layer and the body contact layer in a vertical direction is substantially uniform.

24. The semiconductor device according to claim 1, wherein the active region is defined by a single crystal semiconductor layer, wherein the semiconductor layer is in a form of a nanosheet or a nanowire.

25. The semiconductor device according to claim 24, wherein the semiconductor layer comprises a vertical extension portion extending in a vertical direction to provide the active region and a lateral extension portion extending from a lower end of the vertical extension portion on the first side, and the semiconductor device further comprises:
a lower source/drain region contact portion to the lower source/drain region, wherein the lower source/drain region contact portion is landed on the lateral extension portion of the semiconductor layer; and
a lower source/drain region defining layer extending from below the lateral extension portion of the semiconductor layer to a surface of the semiconductor layer on the second side.

26. The semiconductor device according to claim 25, wherein the lower source/drain region defining layer comprises a dopant of a same conductivity type as the lower source/drain region, and the lower source/drain region is self-aligned with a portion of the lower source/drain region defining layer on the second side.

27. The semiconductor device according to claim 25, wherein the lower source/drain region defining layer comprises a single crystal semiconductor.

28. The semiconductor device according to claim 25, wherein a spacing between the lower source/drain region defining layer and the body contact layer in the vertical direction is substantially uniform.

29. The semiconductor device according to claim 1, wherein the first gate stack and the second gate stack are self-aligned with the middle portion of the active region.

30. An electronic apparatus comprising the semiconductor device according to claim 1.

31. The electronic apparatus according to claim 30, wherein the electronic apparatus comprises a smart phone, a personal computer, a tablet computer, an artificial intelligence apparatus, a wearable apparatus, a mobile power supply, an automotive electronic apparatus, a communication apparatus or an Internet of Things apparatus.

32. A method of manufacturing a semiconductor device, comprising:
providing, on a substrate, a stack of a first source/drain defining layer, a first channel defining layer, a body contact defining layer, a second channel defining layer and a second source/drain defining layer;
forming an active layer on a vertical sidewall of the stack extending in a first direction;
respectively driving a dopant in the first source/drain defining layer, a dopant in the body contact defining layer and a dopant in the second source/drain defining layer into corresponding portions of the active layer, so as to form a lower source/drain region, a body contact region and an upper source/drain region, respectively;
forming an isolation layer surrounding the stack;
removing the first channel defining layer and the second channel defining layer;
forming a gate stack on the isolation layer, wherein the gate stack comprises a first gate stack and a second gate stack, the first gate stack and the second gate stack are disposed on a first side and a second side which are opposite to each other in a second direction intersecting the first direction, and the second gate stack enters a space between the first source/drain defining layer and the body contact defining layer and a space between the body contact defining layer and the second source/drain defining layer; and forming a body contact portion to the body contact defining layer.

33. The method according to claim 32, wherein the stack and the active layer are formed by an epitaxial growth process.

34. The method according to claim 32, wherein the isolation layer surrounding the stack has a substantially flat top surface, so that the first gate stack and the second gate stack formed on the isolation layer are integrated with each other and continuously extend around a periphery of the active region.

35. The method according to claim 32, wherein the isolation layer has a protrusion portion on two opposite sides of the stack in the first direction, so that the first gate stack and the second gate stack formed on the isolation layer are electrically isolated from each other through the protrusion portion.

36. The method according to claim 35, wherein the second gate stack comprises a first portion and a second portion stacked in a vertical direction.

37. The method according to claim 35, wherein the forming the gate stack comprises:

forming a first gate dielectric layer on the isolation layer;

forming a first gate conductor layer on the first gate dielectric layer;

removing a portion of the first gate conductor layer on a second side of the protrusion portion; and forming, on the second side of the protrusion portion, a second gate conductor layer on the first gate dielectric layer.

38. The method according to claim 37, further comprising:

etching back the second gate conductor layer;

selectively etching a portion of the first gate dielectric layer exposed by the etched second gate conductor layer;

forming a second gate dielectric layer; and forming a third gate conductor layer on the second gate dielectric layer.

39. The method according to claim 32, further comprising:

patterning the stack, so that the body contact defining layer protrudes with respect to the second source/drain defining layer, wherein the body contact portion is landed on a portion of the body contact defining layer protruding with respect to the second source/drain defining layer.

* * * * *